United States Patent
Noguchi

(10) Patent No.: US 10,444,452 B2
(45) Date of Patent: Oct. 15, 2019

(54) OPTICAL MODULE AND OPTICAL TRANSMISSION EQUIPMENT

(71) Applicant: Oclaro Japan, Inc., Sagamihara, Kanagawa (JP)

(72) Inventor: Daisuke Noguchi, Kanagawa (JP)

(73) Assignee: Lumentum Japan, Inc., Kanagawa (JP)

(*) Notice: Subject to any disclaimer, the term of this patent is extended or adjusted under 35 U.S.C. 154(b) by 0 days.

(21) Appl. No.: 15/840,199

(22) Filed: Dec. 13, 2017

(65) Prior Publication Data
US 2018/0172933 A1    Jun. 21, 2018

(30) Foreign Application Priority Data
Dec. 20, 2016    (JP) .................. 2016-246745

(51) Int. Cl.
| H04B 10/40 | (2013.01) |
| G02B 6/42 | (2006.01) |
| H05K 1/14 | (2006.01) |
| H05K 3/10 | (2006.01) |
| H05K 1/11 | (2006.01) |

(52) U.S. Cl.
CPC ......... G02B 6/4281 (2013.01); G02B 6/4203 (2013.01); G02B 6/4215 (2013.01); H04B 10/40 (2013.01); H05K 1/147 (2013.01); H05K 1/148 (2013.01); H05K 3/103 (2013.01); H05K 1/118 (2013.01); *H05K 2201/10121* (2013.01)

(58) Field of Classification Search
CPC .. G02B 6/4281; G02B 6/4203; G02B 6/4215; H04B 10/40; H05K 1/118; H05K 1/148; H05K 3/103; H05K 1/147; H05K 2201/10121

USPC .................. 398/135–139, 182–214
See application file for complete search history.

(56) References Cited

U.S. PATENT DOCUMENTS 5,512,073 A * 4/1996 Mirza ................... B01D 46/10
                                                    126/299 R
6,160,647 A * 12/2000 Gilliland .............. H04B 10/504
                                                    398/1

(Continued)

FOREIGN PATENT DOCUMENTS

| JP | 2003-209327 A | 7/2003 |
| JP | 2016-178218 A | 10/2016 |

OTHER PUBLICATIONS

Chinese Office Action received in corresponding Chinese Application No. 201711319506.9 dated Jul. 30, 2019.

*Primary Examiner* — Kenneth N Vanderpuye
*Assistant Examiner* — Dibson J Sanchez
(74) *Attorney, Agent, or Firm* — Mattingly & Malur, PC

(57) ABSTRACT

There is provided an optical module, including a first optical subassembly, a second optical subassembly, a first flexible printed circuit board, and a second flexible printed circuit board. The first/second optical subassembly includes a first/second normal phase lead terminal and a first/second reverse phase lead terminal, arranged in a positive direction of a first orientation. The first/second flexible printed circuit board includes a first/second normal phase strip conductor, a first/second reverse phase strip conductor, and a ground conductor layer. The back surface of the first/second flexible printed circuit board faces the end surface of the first/second optical subassembly. The first/second normal phase strip conductor extends in a positive/negative direction of a second orientation.

11 Claims, 14 Drawing Sheets

(56) References Cited

U.S. PATENT DOCUMENTS

| | | | | |
|---|---|---|---|---|
| 6,922,231 B1* | 7/2005 | Wang | | H01L 31/02016 |
| | | | | 356/73.1 |
| 7,260,285 B2* | 8/2007 | Mitamura | | G02B 6/4201 |
| | | | | 385/14 |
| 7,822,346 B2 | 10/2010 | Rosenberg | | |
| 7,991,029 B2* | 8/2011 | Aruga | | H05K 1/0243 |
| | | | | 257/706 |
| 2003/0142929 A1* | 7/2003 | Bartur | | G02B 6/4214 |
| | | | | 385/92 |
| 2004/0086240 A1* | 5/2004 | Togami | | G02B 6/4246 |
| | | | | 385/92 |
| 2004/0092135 A1* | 5/2004 | Hofmeister | | H01R 11/30 |
| | | | | 439/39 |
| 2004/0190835 A1* | 9/2004 | Burdick | | H05K 1/0218 |
| | | | | 385/89 |
| 2004/0264882 A1* | 12/2004 | Torigoe | | G02B 6/4201 |
| | | | | 385/88 |
| 2005/0194663 A1* | 9/2005 | Ishimura | | H01S 5/02212 |
| | | | | 257/666 |
| 2006/0133819 A1* | 6/2006 | Yu | | H04B 10/501 |
| | | | | 398/164 |
| 2007/0058980 A1* | 3/2007 | Hidaka | | G02B 6/4201 |
| | | | | 398/138 |
| 2007/0177884 A1* | 8/2007 | Kagaya | | H03F 3/087 |
| | | | | 398/202 |
| 2007/0286553 A1* | 12/2007 | Sone | | H05K 1/147 |
| | | | | 385/53 |
| 2008/0080577 A1* | 4/2008 | Nguyen | | H04B 10/40 |
| | | | | 398/135 |
| 2008/0145060 A1* | 6/2008 | Nelson | | G02B 6/4201 |
| | | | | 398/135 |
| 2009/0028557 A1* | 1/2009 | Togami et al. | | G02B 6/4225 |
| 2009/0052898 A1* | 2/2009 | Oki | | G02B 6/4246 |
| | | | | 398/79 |
| 2009/0123116 A1* | 5/2009 | Tanaka | | G02B 6/4201 |
| | | | | 385/92 |
| 2010/0061736 A1* | 3/2010 | Kawaguchi | | H05K 1/0234 |
| | | | | 398/139 |
| 2010/0232806 A1* | 9/2010 | Kagaya | | H04B 10/2504 |
| | | | | 398/183 |
| 2012/0269522 A1* | 10/2012 | Kagaya | | H01P 3/026 |
| | | | | 398/183 |
| 2014/0099123 A1* | 4/2014 | Kang | | G02B 6/4281 |
| | | | | 398/135 |
| 2015/0010310 A1* | 1/2015 | Chien | | G02B 6/4277 |
| | | | | 398/116 |
| 2015/0256261 A1* | 9/2015 | Ho | | G02B 6/43 |
| | | | | 398/139 |
| 2016/0277116 A1 | 9/2016 | Hasegawa et al. | | |
| 2018/0172928 A1* | 6/2018 | Ho | | G02B 6/4246 |

\* cited by examiner

OPTICAL MODULE AND OPTICAL TRANSMISSION EQUIPMENT

CROSS-REFERENCE TO RELATED APPLICATION

The present application claims priority from Japanese application JP 2016-246745, filed on Dec. 20, 2016, the content of which is hereby incorporated by reference into this application.

BACKGROUND OF THE INVENTION

1. Field of the Invention

The present invention relates to an optical module and optical transmission equipment, particularly to a technology in which a plurality of optical subassemblies are mounted in an optical module with a simple configuration.

2. Description of the Related Art

Recently, a request of reduction in size and cost of an optical module capable of dense transmission has been risen. A technology of transmitting a large capacity signal, which is referred to as wavelength division multiplexing (WDM) is used for dense transmission. In the WDM, a wavelength division multiplexed optical signal is generated by performing multiplexing of a plurality of optical signals having wavelengths different from each other, or a plurality of optical signals having wavelengths different from each other are generated by performing de-multiplexing of a wavelength division multiplexed optical signal.

In a case where the optical module is an optical transmitter module, or in a case where the optical module includes an optical transmitter module, the optical transmitter module includes a plurality of light-emitting elements that emit optical signals having wavelengths different from each other. In a case where the optical module is an optical receiver module, or in a case where the optical module includes an optical receiver module, the optical receiver module includes a plurality of light-receiving elements that receive optical signals having wavelengths different from each other. In the related art, a light-emitting element array in which a plurality of light-emitting elements are integrated with each other, or a light-receiving element array in which a plurality of light-receiving elements are integrated with each other is used. The array type includes a form in which each of elements is mounted on one submount, in addition to a form in which a plurality of elements are integrated with each other on a single substrate. JP 2016-178218 A discloses a structure of an optical module including an array type light-emitting element.

SUMMARY OF THE INVENTION

However, in an optical element array such as a light-emitting element array or a light-receiving element array, in which a plurality of optical elements are integrate, in a case where even one of the plurality of optical elements included in the optical element array does not satisfy the standard condition, the optical element array itself does not satisfy the standard condition. Thus, yield is deteriorated, and manufacturing cost is increased. In addition, for example, in an optical element array in which a plurality of optical elements are monolithically integrated on the same semiconductor substrate, manufacturing cost is increased because, for example, an active layer of each of the optical element is formed in an individual process.

In order to preferentially achieve reduction of cost, an optical module in which a plurality of optical subassemblies are mounted is desired. Here, each of the plurality of optical subassemblies includes one light conversion element configured to emit an optical signal having a different wavelength or receive light having a different wavelength. However, if a plurality of optical subassemblies are mounted in an optical module, a space for the plurality of optical subassemblies is required, and thus it is difficult to reduce the size of the optical module.

In order to realize reduction in size, it is considered that a plurality of optical subassemblies are arranged three-dimensionally rather than planarly. In this case, for space constraints, it is desired that some of the optical subassemblies are connected to a group of terminals disposed on the front surface of a printed circuit board and others are connected to a group of terminals disposed on the back surface of the printed circuit board. In order to realize reduction of cost, the plurality of optical subassemblies may be controlled by a common IC. For this, any of, for example, methods; a method in which groups of terminals of the IC are specially arranged; a method in which a transmission line of the printed circuit board is set to have a special structure; and a method in which a transmission line of a flexible printed circuit board, which connects the optical subassemblies and the printed circuit board is set to have a special structure is required. Thus, this acts as a factor of hindering reduction in size and cost.

Considering the above problems, an object of the present invention is to provide an optical module and optical transmission equipment which are realized with a simple configuration, and include a plurality of optical subassemblies mounted therein.

(1) To solve the above problems, according to the present invention, an optical module includes a first optical subassembly, a second optical subassembly, a first flexible printed circuit board, a second flexible printed circuit board, a printed circuit board, and an IC. The first optical subassembly includes a first normal phase lead terminal and a first reverse phase lead terminal which are disposed on an end surface so as to be in a row in order in a positive direction of a first orientation. The second optical subassembly includes a second normal phase lead terminal and a second reverse phase lead terminal which are disposed on the end surface so as to be in a row in order in the positive direction of the first orientation. The first flexible printed circuit board includes a first normal phase strip conductor connected to the first normal phase lead terminal, a first reverse phase strip conductor connected to the first reverse phase lead terminal, and a ground conductor layer disposed on a back surface. The first normal phase strip conductor and the first reverse phase strip conductor are disposed on a front surface to extend in parallel with each other. The second flexible printed circuit board includes a second normal phase strip conductor connected to the second normal phase lead terminal, a second reverse phase strip conductor connected to the second reverse phase lead terminal, and a ground conductor layer disposed on the back surface. The second normal phase strip conductor and the second reverse phase strip conductor are disposed on the front surface to extend in parallel with each other. The printed circuit board includes a first surface and a second surface. The IC is mounted on any one of the first surface and the second surface of the printed circuit board, and is electrically connected to the first optical subassembly and the second optical subassembly together. The first flexible printed circuit board is connected to the first optical subassembly so as to cause the back surface of the first flexible printed circuit board to face the end surface of the first optical subassembly. The second flexible printed circuit board is connected to the second optical subassembly so as to cause the back surface of the second flexible printed circuit board to face the end surface of the second optical subassembly. The first normal phase strip conductor and the first reverse phase strip conductor of the first flexible printed circuit board extend at a connection portion with the end surface of the first optical subassembly in a positive direction of a second orientation which intersects with the first orientation. The second normal phase strip conductor and the second reverse phase strip conductor of the second flexible printed circuit board extend at a connection portion with the end surface of the second optical subassembly in a negative direction of the second orientation.

(2) In the optical module described in (1), a normal orientation of the first surface of the printed circuit board and a normal orientation of the second surface thereof may be directed in the second orientation together. The printed circuit board may further include a first normal phase board terminal connected to the first normal phase strip conductor and a first reverse phase board terminal connected to the first reverse phase strip conductor. The first normal phase board terminal and the first reverse phase board terminal may be disposed on the first surface in a row in order in the positive direction of the first orientation. The printed circuit board may further include a second normal phase board terminal connected to the second normal phase strip conductor and a second reverse phase board terminal connected to the second reverse phase strip conductor. The second normal phase board terminal and the second reverse phase board terminal may be disposed on the second surface in a row in order in the positive direction of the first orientation.

(3) In the optical module described in (2), the first surface of the printed circuit board rather than the second surface may be disposed on a positive side of the second orientation. The first flexible printed circuit board may be connected to cause the front surface to face the first surface. The second flexible printed circuit board may be connected to cause the front surface to face the second surface.

(4) In the optical module described in (2), the first surface of the printed circuit board rather than the second surface may be disposed on a negative side of the second orientation. The first flexible printed circuit board may be connected to cause the back surface to face the first surface. The second flexible printed circuit board may be connected to cause the back surface to face the second surface.

(5) In the optical module described in any of (1) to (4), the first optical subassembly and the second optical subassembly may be disposed in a row in the second orientation.

(6) In the optical module described in (3), the first optical subassembly and the second optical subassembly may be disposed in a row in order in the negative direction of the second orientation.

(7) In the optical module described in (4), the first optical subassembly and the second optical subassembly may be disposed in a row in order in the positive direction of the second orientation.

(8) In the optical module described in (5), the printed circuit board may further include: a first differential transmission line connected to the first normal phase board terminal and the first reverse phase board terminal; and a second differential transmission line connected to the second normal phase board terminal and the second reverse phase board terminal. The IC may include a first normal phase IC terminal and a first reverse phase IC terminal which are disposed in a row in order in a positive direction of a third orientation, and include a second normal phase IC terminal and a second reverse phase IC terminal which are disposed in a row in order in the positive direction of the third orientation. The IC may be mounted on the first surface of the printed circuit board. The first differential transmission line may extend from the first normal phase board terminal and the first reverse phase board terminal on the first surface, so as to be connected to the first normal phase IC terminal and the first reverse phase IC terminal. The second differential transmission line may extend from the second normal phase board terminal and the second reverse phase board terminal on the second surface, extend from the second surface to the first surface in a stacking direction, and then extend on the first surface so as to be connected to the second normal phase IC terminal and the second reverse phase IC terminal.

(9) In the optical module described in (8), the positive direction of the third orientation may correspond to the positive direction of the first orientation.

(10) In the optical module described in any of (1) to (9), the first flexible printed circuit board and the second flexible printed circuit board may have a common structure.

(11) In the optical module described in any of (1) to (10), the first optical subassembly and the second optical subassembly may have a common structure except that each of the first optical subassembly and the second optical subassembly includes a light-emitting element configured to emit an optical signal of a different wavelength.

(12) According to the present invention, optical transmission equipment may include the optical module which is described in any of (1) to (11) and is mounted therein.

According to the present invention, there are provided an optical module and optical transmission equipment which are realized with a simple configuration, and include a plurality of optical subassemblies mounted therein.

DETAILED DESCRIPTION OF THE INVENTION

Figure 1:
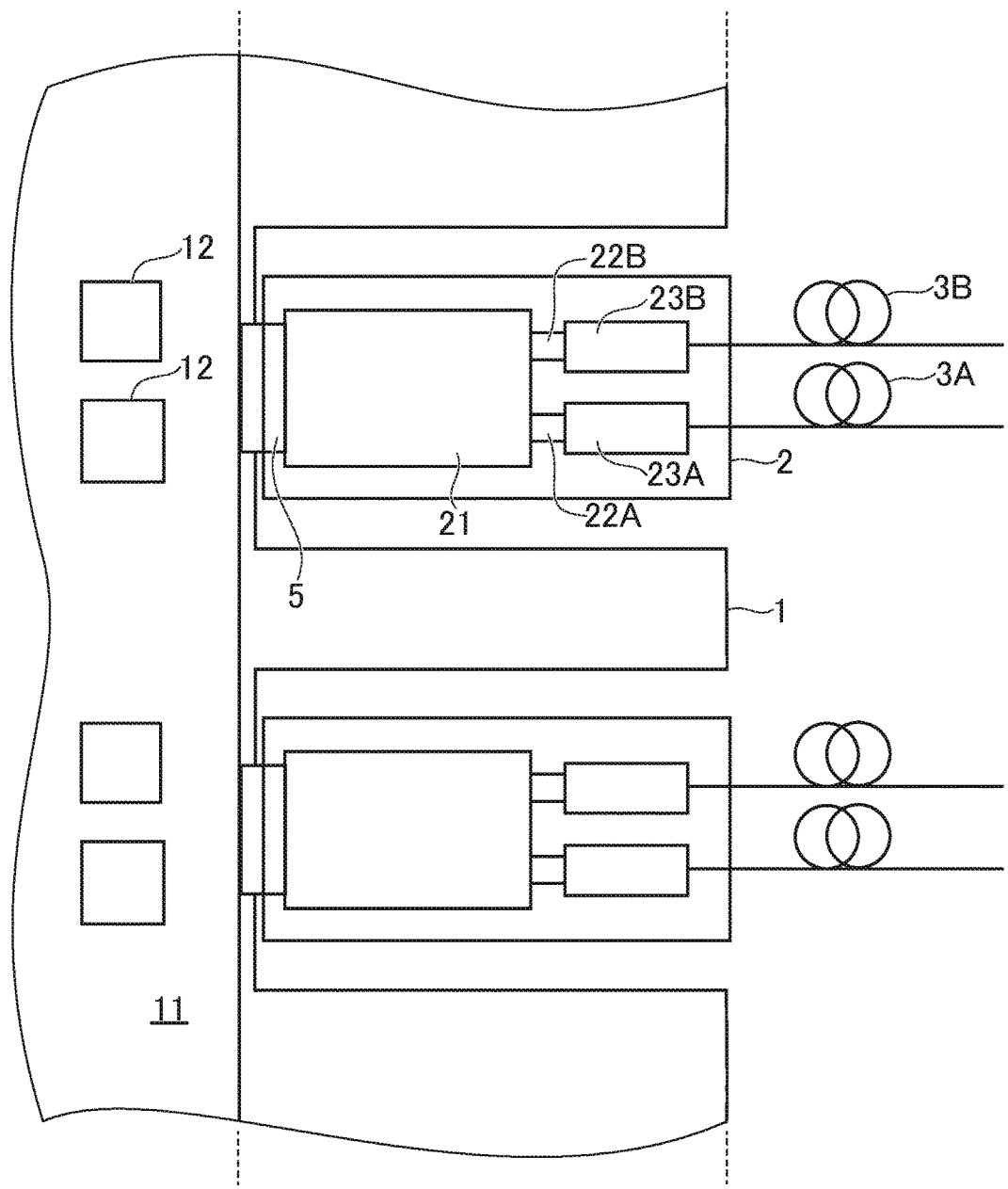
FIG. 1 is a schematic diagram illustrating a configuration of optical transmission equipment and an optical module according to a first embodiment of the present invention.

Hereinafter, embodiments of the present invention will be specifically described in detail with reference to the drawings. In all of the drawings for describing the embodiments, members having the same function are denoted by the same reference signs and repetitive descriptions thereof will be omitted. The drawings which will be illustrated below are just used for describing examples of the embodiments. The size of constituent components in the drawings and the scale which will be described in the examples do not necessarily coincide with each other.

First Embodiment

FIG. 1 is a schematic diagram illustrating a configuration of optical transmission equipment 1 and an optical module 2 according to a first embodiment of the present invention. The optical transmission equipment 1 includes a printed circuit board 11 and an IC 12. A plurality of optical modules 2 are mounted on the optical transmission equipment 1 by electric ports 5, respectively. The optical transmission equipment 1 is, for example, a router or a switch of high capacity. For example, the optical transmission equipment 1 has a function of a switch board, and thus is disposed in a base station or the like. The optical transmission equipment 1 acquires reception data (receiving electric signal) by the optical module 2. The optical transmission equipment 1 determines data to be transmitted and a transmission destination, generates transmission data (transmitting electric signal), and transfers the generated data to the corresponding optical module 2, by using the IC 12 and the like which are mounted in the printed circuit board 11.

The optical module 2 is a transceiver which has a function of optical transmitting and a function of optical receiving. The optical module 2 includes a printed circuit board 21, flexible printed circuit boards 22A and 22B, an optical transmitter section 23A, and an optical receiver section 23B. The optical transmitter section 23A converts electric signals into optical signals and transmits the optical signals to an optical fiber 3A. The optical receiver section 23B converts optical signals received via an optical fiber 3B into electric signals. The printed circuit board 21 and the optical transmitter section 23A are connected to each other via the flexible printed circuit board 22A. The printed circuit board 21 and the optical receiver section 23B are connected to each other via the flexible printed circuit board 22B. Electric signals are transmitted to the optical transmitter section 23A via the flexible printed circuit board 22A by the printed circuit board 21. Electric signals are transmitted to the printed circuit board 21 via the flexible printed circuit board 22B by the optical receiver section 23B. A light conversion element is an element configured to convert an optical signal into an electric signal or to convert an electric signal into an optical signal. A light conversion element that converts an electric signal into an optical signal functions as a light-emitting element, and a light conversion element that converts an optical signal into an electric signal functions as a light-receiving element. The optical transmitter section 23A includes one or a plurality (here, four) of light-emitting elements. The optical receiver section 23B includes one or a plurality (here, four) of light-receiving elements.

A transmission system according to the embodiment includes two or more optical transmission equipments 1, two or more optical modules 2, and one or more optical fibers 3. One or more optical modules 2 are mounted on each of the two or more optical transmission equipments 1. The optical modules 2 which are respectively mounted on the two optical transmission equipments 1 are connected to each other by the optical fiber 3 (for example, optical fiber 3A). Transmission data generated by one of the two optical transmission equipments 1 is converted into an optical signal by the optical module 2 mounted therein, and the optical signal is transmitted to the optical fiber 3. The optical signal transmitted on the optical fiber 3 is received by the optical module 2 mounted on the other of the two optical transmission equipments 1. The optical module 2 converts the optical signal into an electric signal and transmits the electric signal to the other of the two optical transmission equipment 1 as reception data.

The optical transmission equipment 1 and the optical module 2 according to the embodiment correspond to high speed optical fiber transmission of a bit rate which is about 100 Gbit/s, and satisfy the request for distribution and speed-up of a broadband network with an increase of communication traffic in the recent years. The optical module 2 according to the embodiment is an optical transceiver which satisfies the request for reduction in size and cost. Nowadays, for the optical transceiver (optical module), Multi Source Agreement (MSA) between a plurality of manufacturers is signed, and thus commercialization in a state where electric characteristics, optical characteristics, external dimensions, and the like are set based on the same standards is in progress. The MSA based on the Ethernet (Registered Trademark) leads. Regarding the external dimensions of an optical module, for example, the standards of a CFP2, a CFP4, a QSFP28 having a size which is obtained by reducing the external size of a 100 Gbit/s optical communication module CFP (100 Gigabit Form Factor Pluggable) or a 100 Gbit/s optical communication module CFP are provided. The position of an optical transmission receptacle, an optical reception receptacle, or an electric interface card edge is determined based on the above standards. It is considered that the flow of standardization and reduction in size as described above continue.

The optical module 2 according to the embodiment is, for example, based on the MSA standards of the QSFP28 and the CFP4. Reduction of a case volume and a decrease of the number of components are in progress based on the standards. A transmission system based on the standards is a wavelength division multiplexing (WDM) transmission system for 4 wavelengths. Four light-emitting elements (for example, semiconductor laser elements) configured to emit optical signals having wavelengths different from each other are used in the optical transmitter section 23A. A 4-channel differential transmission lines for transmitting and a 4-channel differential transmission lines for receiving are disposed on the printed circuit board 21 included in the optical module 2. The specification of an electric signal for serial data is based on OIF CEI-28G. A bit rate of an electric signal which is transmitted on each channel has any value in a range of 25 Gbit/s to 28 Gbit/s. Modulation driving is performed on the four light-emitting elements for each channel by a driver circuit. As the light-emitting element, a direct-modulation DFB-LD element (distributed feedback laser) is suitably used from a viewpoint of reduction in cost.

Figure 2:
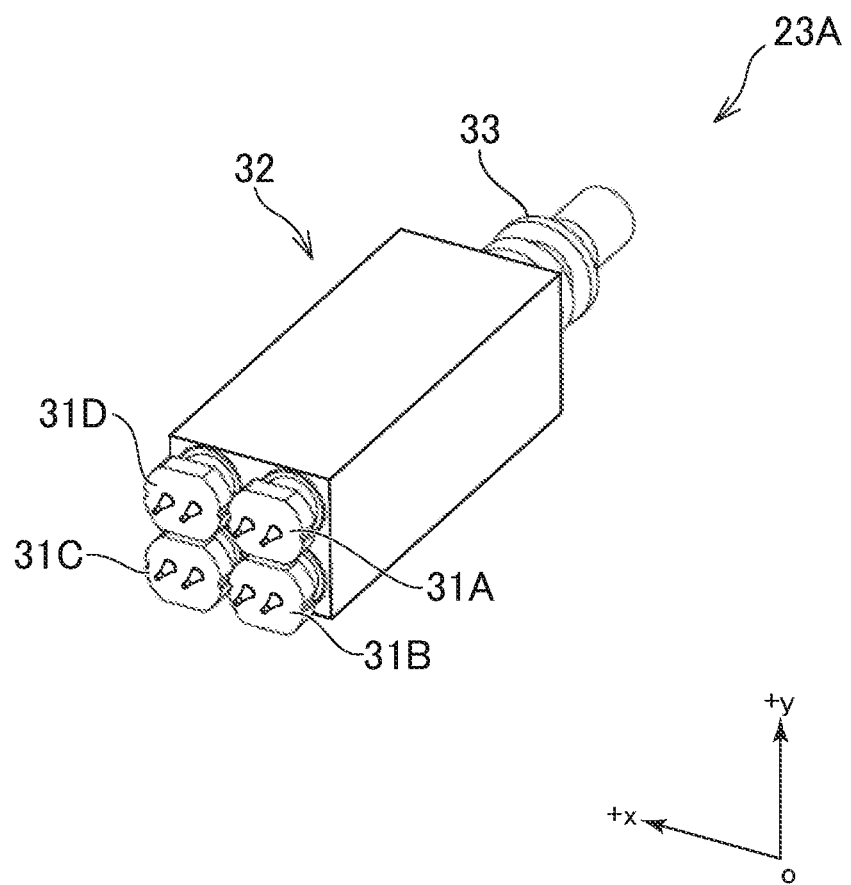
FIG. 2 is a perspective view schematically illustrating a configuration of an optical transmitter section according to the first embodiment of the present invention.

FIG. 2 is a perspective view schematically illustrating a configuration of the optical transmitter section 23A according to the embodiment. The optical transmitter section 23A according to the embodiment includes 4 laser diode (LD) modules 31A, 31B, 31C, and 31D, and an optical MUX module 32 (multiplexer). Each of the LD module corresponds to an optical subassembly. The optical MUX module 32 has an optical multiplexing function of the optical transmitter section 23A, and includes a sleeve assembly 33 for connecting multiplexed light (wavelength division multiplexed optical signal) to the external optical fiber 3A. The 4 LD modules 31A, 31B, 31C, and 31D respectively emit optical signals having wavelengths different from each other. For example, for the purpose of CWDM, the 4 LD modules 31A, 31B, 31C, and 31D emit optical signals having light wavelengths in 4 wavelength bands, that is, a wavelength band of 1271 nm, a wavelength band of 1291 nm, and a wavelength band of 1311 nm, and a wavelength band of 1331 nm, respectively.

Figure 3:
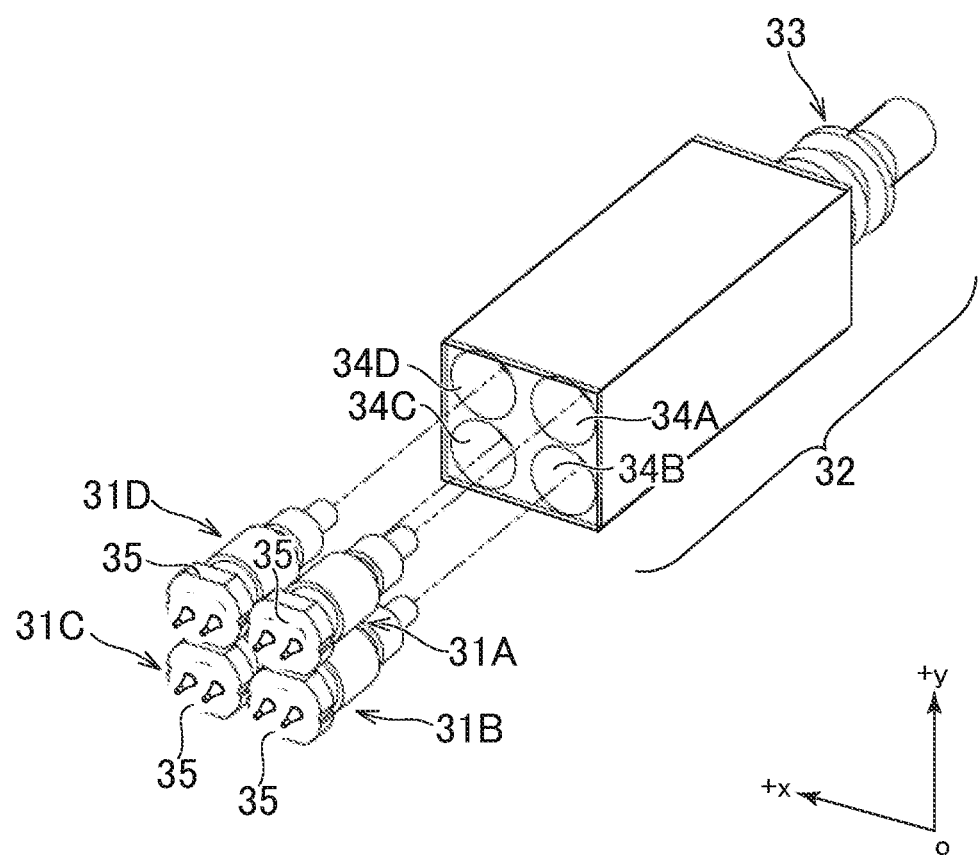
FIG. 3 is a perspective view schematically illustrating a configuration of the optical transmitter section according to the first embodiment of the present invention.

FIG. 3 is a perspective view schematically illustrating the configuration of the optical transmitter section 23A according to the embodiment. FIG. 3 illustrates a state of excluding the LD modules 31A, 31B, 31C, and 31D from the optical transmitter section 23A illustrated in FIG. 2. The optical MUX module 32 has 4 installation portions 34A, 34B, 34C, and 34D. The 4 installation portions 34A, 34B, 34C, and 34D come into contact with joint places to tips (ferrules 38 which will be described later) of the 4 LD modules 31A, 31B, 31C, and 31D, and thus are jointed to the tips of the 4 LD modules, respectively. Each of the installation portions has a function of holding and fixing the LD module. Each of the LD modules includes a stem 35 on a side of being connected to the flexible printed circuit board 22A. The stem 35 includes one pair of lead terminals. A +x direction illustrated in FIGS. 2 and 3 corresponds to a positive direction of a first orientation. A +y direction illustrated in FIGS. 2 and 3 corresponds to a positive direction of a second orientation. The second orientation corresponds to an orientation which intersects with the first orientation. Here, the second orientation and the first orientation are orthogonal.

Figure 4:
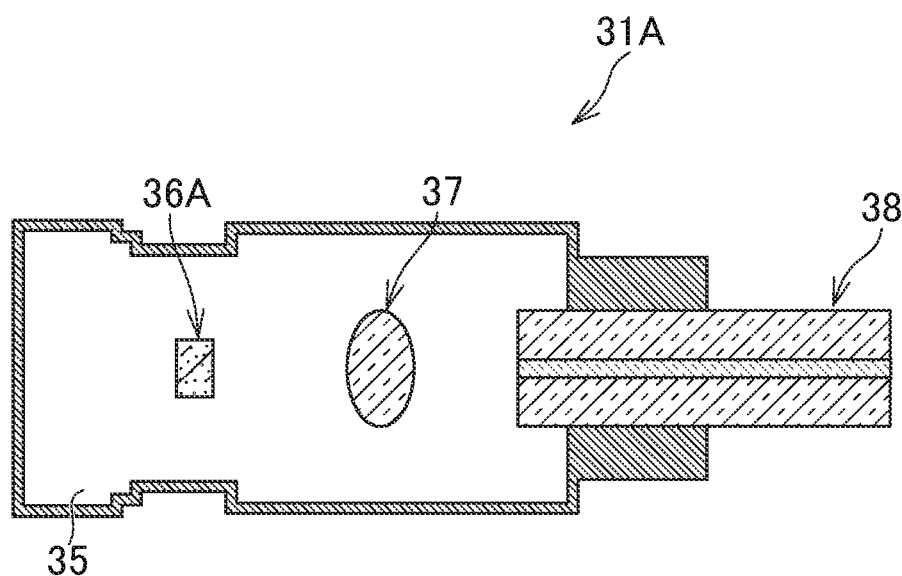
FIG. 4 is a cross-sectional view schematically illustrating a configuration of an LD module according to the first embodiment of the present invention.

FIG. 4 is a cross-sectional view schematically illustrating a configuration of the LD module 31A according to the embodiment. Other LD modules 31B, 31C, and 31D also have the same configuration. Here, the LD module 31A will be described. The LD module 31A further includes an LD element 36A, a collective lens 37, and a ferrule 38. Each of the LD modules includes one LD element. A direct-modulation DFB-LD element is used as each LD element. The LD element 36A corresponds to a light-emitting element that converts an electric signal into an optical signal. The LD modules 31B, 31C, and 31D include LD elements 36B, 36C, and 36D, respectively. The LD elements 36A, 36B, 36C, and 36D have the common structure except for the different semiconductor multilayer structures, from a point of emitting optical signals having wavelengths different from each other. The LD modules 31A, 31B, 31C, and 31D have the common structure except for the LD elements 36A, 36B, 36C, and 36D.

Figure 5A:
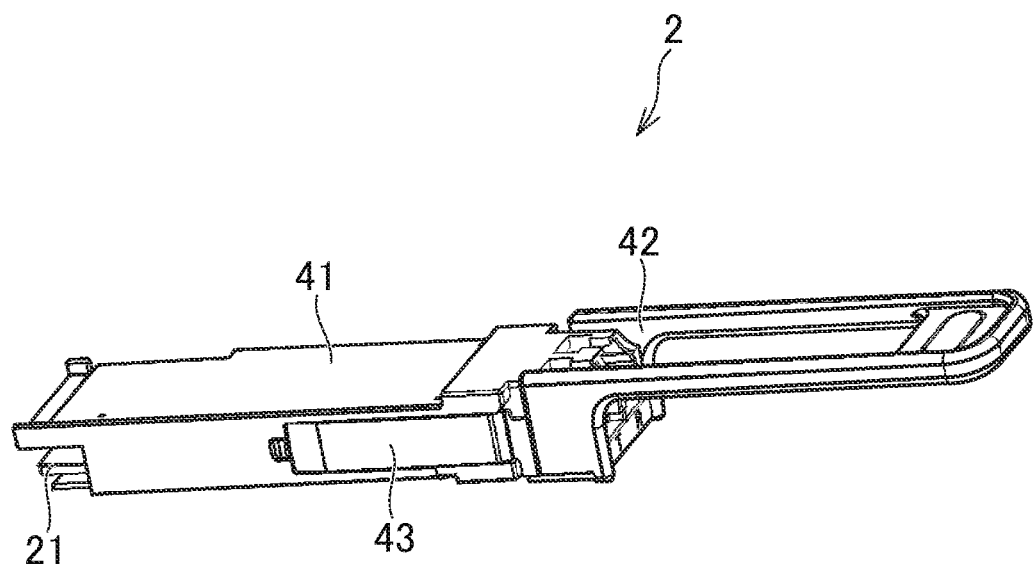
FIG. 5A is a perspective view schematically illustrating a configuration of the optical module according to the first embodiment of the present invention.
Figure 5B:
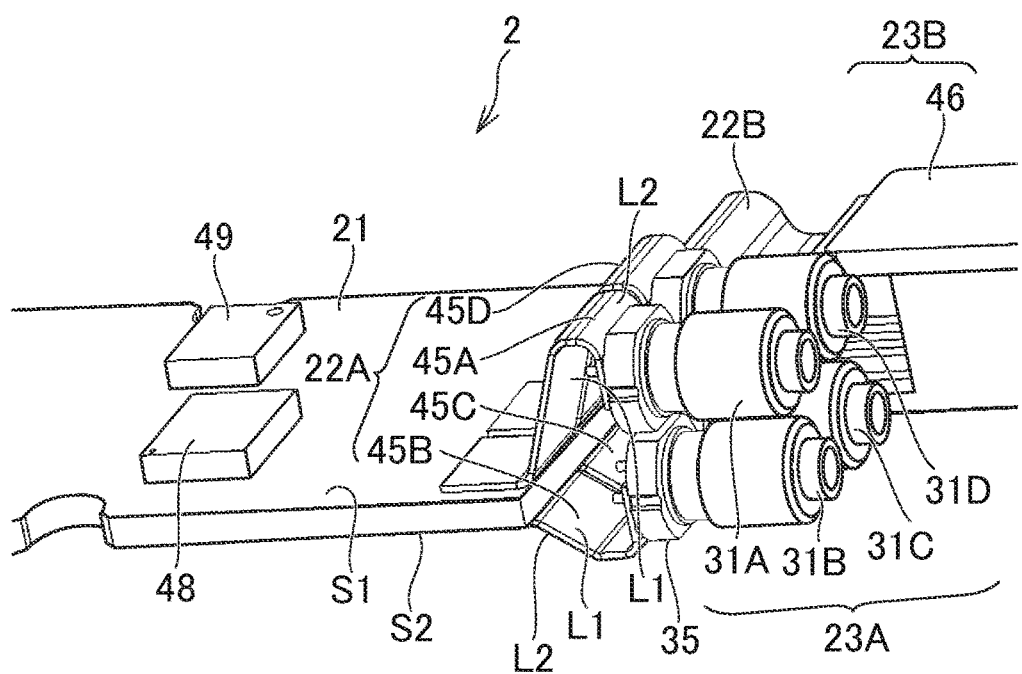
FIG. 5B is a perspective view schematically illustrating the configuration of the optical module according to the first embodiment of the present invention.

FIGS. 5A and 5B are perspective diagrams schematically illustrating the configuration of the optical module 2 according to the embodiment. FIG. 5A is an external view illustrating the optical module 2. FIG. 5B illustrates main components mounted in the optical module 2. As described above, the optical module 2 is an optical transceiver of a bit rate which is about 100 Gbit/s. Here, the optical module 2 is based on the MSA standards of the QSFP28. As illustrated in FIG. 5A, the optical module 2 includes a case 41, a pulltab 42, a slider 43, and the printed circuit board 21. The main components constitute an appearance of the optical module 2. The case 41 is formed by molding processing in a manner that die cast is performed by using metal such as zinc. The slider 43 is formed by sheet metal working with metal such as stainless steel. The pulltab 42 is formed by injection molding with a thermoplastic elastomer. The above components are suitably formed by the above methods, respectively, from a viewpoint of reduction in cost.

Then, the main components mounted in the case 41 of the optical module 2 will be described with reference to FIG. 5B. For simple descriptions, FIG. 5B does not illustrate the optical MUX module 32. As illustrated in FIG. 1, the optical module 2 includes the printed circuit board 21, the flexible printed circuit boards 22A and 22B, the optical transmitter section 23A, and the optical receiver section 23B. The optical transmitter section 23A includes the four LD modules 31A, 31B, 31C, and 31D which respectively correspond to wavelengths. Each of the LD modules corresponds to a TO-CAN transmitter optical subassembly (TOSA). Practically, the flexible printed circuit board 22A illustrated in FIG. 1 includes four flexible printed circuit boards 45A, 45B, 45C, and 45D. The four flexible printed circuit boards 45A, 45B, 45C, and 45D are subflexible printed circuit boards for the flexible printed circuit board 22A. The diameter size of each of the LD modules (TO-CAN TOSAs) is, here, 3.8 mm. Here, the four LD modules are arranged up and down in two rows in the optical module 2. The two upper LD modules 31A and 31D are disposed in a row in order in the +x direction (positive direction of the first orientation) illustrated in FIG. 5B. The flexible printed circuit boards 45A and 45D are connected to the LD modules 31A and 31D so as to cause end surfaces (connection surface 35A of the stem 35: not illustrated) of the LD modules 31A and 31D to face back surfaces L2 of the flexible printed circuit boards 45A and 45D, respectively. The flexible printed circuit boards 45A and 45D are connected to the printed circuit board 21 so as to cause front surfaces L1 of the flexible printed circuit boards 45A and 45D to face a first surface S1 (upper surface) of the printed circuit board 21. The two lower LD modules 31B and 31C are disposed in a row in order in the +x direction (positive direction of the first orientation) illustrated in FIG. 5B. The flexible printed circuit boards 45B and 45C are connected to the LD modules 31B and 31C so as to cause end surfaces (connection surface 35A of the stem 35: not illustrated) of the LD modules 31B and 31C to face the back surfaces L2 of the flexible printed circuit boards 45B and 45C, respectively. The flexible printed circuit boards 45B and 45C are connected to the printed circuit board 21 so as to cause the front surfaces L1 of the flexible printed circuit boards 45B and 45C to face a second surface S2 (lower surface) of the printed circuit board 21. With the above configuration, the components may be mounted in a space in the case 41 based on the MSA standard of the QSFP28.

The optical receiver section 23B in the optical module 2 includes a 4-channel receiver optical subassembly (ROSA) 46 in which four light-receiving elements are mounted. Here, the light-receiving element corresponds to a photodiode (PD) element. The 4-channel ROSA 46 is connected to one end of the flexible printed circuit board 22B. The other end of the flexible printed circuit board 22B is connected to the first surface S1 of the printed circuit board 21.

As illustrated in FIG. 5B, two ICs 48 and 49 are mounted on the first surface (upper surface) S1 of the printed circuit board 21. The IC 48 is a driving IC in which a 4-channel CDR circuit for transmission and a 4-channel driver circuit are integrated. That is, the IC 48 is electrically connected to the LD modules 31A, 31B, 31C, and 31D. The IC 49 is an IC in which a 4-channel CDR circuit for receiving is integrated.

The optical module according to the embodiment includes a first optical subassembly, a second optical subassembly, a first flexible printed circuit board, a second flexible printed circuit board, a printed circuit board, and an IC. The main feature of the optical module according to the embodiment is a connection relationship between the first optical subassembly and the first flexible printed circuit board, and a connection relationship between the second optical subassembly and the second flexible printed circuit board.

Figure 6:
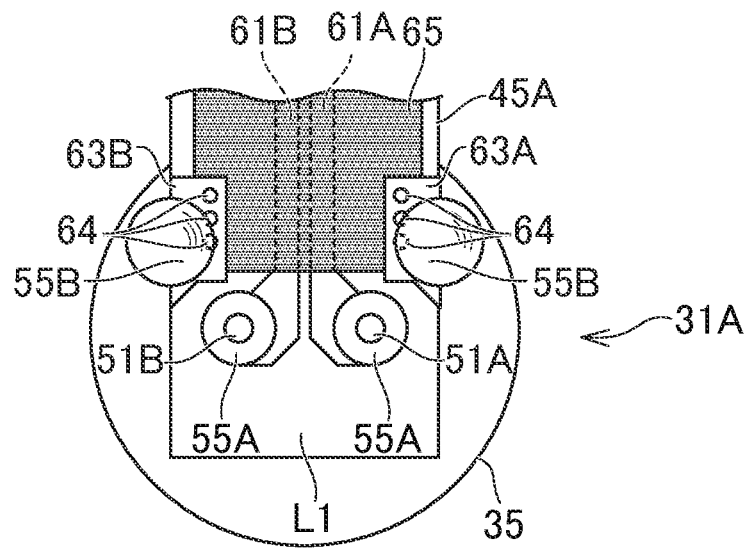
FIG. 6 is a diagram illustrating a connection relationship between two LD modules and two flexible printed circuit boards according to the first embodiment of the present invention.
Figure 6:
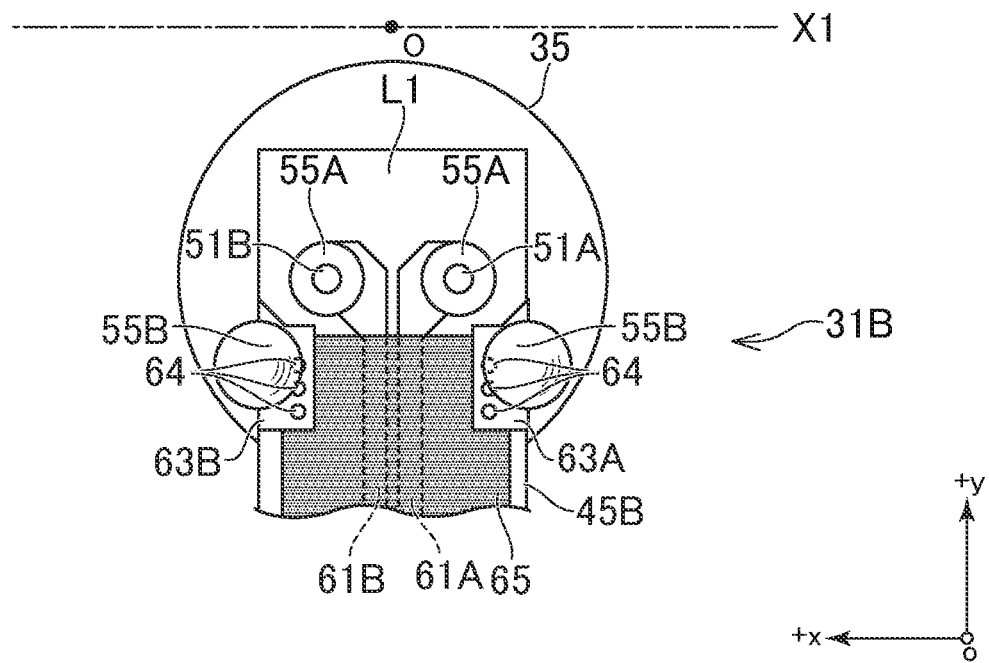

FIG. 6 is a diagram illustrating a connection relationship between the two LD modules 31A and 31B and the two flexible printed circuit boards 45A and 45B according to the embodiment. Here, the upper LD module 31A corresponds to the first optical subassembly, and the lower LD module 31B corresponds to the second optical subassembly. The LD module 31A and the LD module 31B are disposed in a row in the y orientation so as to be in parallel with each other. Here, the LD module 31A and the LD module 31B are disposed in a row in order in the −y direction. The flexible printed circuit board 45A connected to the LD module 31A corresponds to the first flexible printed circuit board. The flexible printed circuit board 45B connected to the LD module 31B corresponds to the second flexible printed circuit board.

The stem 35 of the LD module 31A includes one pair of lead terminals 51A and 51B which are disposed in a row in order in the +x direction (positive direction of the first orientation, the left direction in FIG. 6). That is, the LD module 31A includes the one pair of lead terminals 51A and 51B which are disposed on the end surface of the LD module 31A. Here, the lead terminal 51A corresponds to a first normal phase lead terminal. The lead terminal 51B corresponds to a first reverse phase lead terminal. The lead terminal 51A is electrically connected to a positive electrode (anode) of the LD element 36A in the LD module 31A. The lead terminal 51B is electrically connected to a negative electrode (cathode) of the LD element 36A. The stem 35 of the LD module 31A maintains a ground potential. The stem 35 has a connection surface which is a flat surface facing the back surface L2 of the flexible printed circuit board 45A.

The flexible printed circuit board 45A includes one pair of strip conductors 61A and 61B, a ground conductor layer 62 (not illustrated), and ground conductor patterns 63A and 63B. The strip conductors 61A and 61B are disposed on the front surface L1 of the flexible printed circuit board 45A so as to extend in parallel with each other. The ground conductor layer 62 is disposed on the back surface L2 (not illustrated) thereof. Here, the strip conductor 61A corresponds to a first normal phase strip conductor connected to the lead terminal 51A (conductor functioning as a strip line for transmitting a normal phase signal to the positive electrode of the LD element). The strip conductor 61B corresponds to a first reverse phase strip conductor connected to the lead terminal 51B (conductor functioning as a strip line for transmitting a reverse phase signal to the negative electrode of the LD element). The one pair of strip conductors 61A and 61B are disposed at a connection portion with the end surface of the LD module 31A in a row in order in the +x direction, and extend in parallel with each other in the +y direction (positive direction of the second orientation). Each of the one pair of strip conductors 61A and 61B has an opening at one end. The opening is provided for penetrating the one pair of lead terminals 51A and 51B. The ground conductor patterns 63A and 63B are disposed at both edges of the front surface L1 of the flexible printed circuit board 45A, respectively. A plurality of through-holes 64 are provided in order to penetrate the ground conductor patterns 63A and 63B disposed on the front surface L1 and the ground conductor layer 62 disposed on the back surface L2, respectively.

The flexible printed circuit board 45A is disposed in the LD module 31 such that the one pair of lead terminals 51A and 51B on the end surface of the LD module 31A (on the connection surface of the stem 35) penetrate the openings of the one pair of strip conductors 61A and 61B on the flexible printed circuit board 45A. The one pair of lead terminals 51A and 51B are electrically connected to the one pair of strip conductors 61A and 61B via solders 55A, respectively. The connection surface of the stem 35 is electrically connected to each of the ground conductor patterns 63A and 63B of the flexible printed circuit board 45A via solders 55B. (At least some of) The plurality of through-holes 64 are filled with the solders 55B. Thus, the ground conductor patterns 63A and 63B are also electrically connected to the ground conductor layer 62 disposed on the back surface. A coverlay 65 is disposed on the front surface L1 of the flexible printed circuit board 45A. The coverlay 65 covers the one pair of strip conductors 61A and 61B except for a connection region with the pair of lead terminals 51A and 51B and an arrangement region of the solders 55B for electrically connecting the main body of the stem 35 to the two ground conductor patterns 63A and 63B. Similarly, the coverlay 65 (not illustrated) is disposed on the back surface L2 of the flexible printed circuit board 45A. The coverlay 65 covers the ground conductor layer 62 (not illustrated) except for a region which faces the connection surface 35A of the stem 35.

Similar to the LD module 31A, the stem 35 of the LD module 31B includes one pair of lead terminals 51A and 51B which are disposed in a row in order in the +x direction. Here, the lead terminal 51A corresponds to the second normal phase lead terminal. The lead terminal 51B corresponds to the second reverse phase lead terminal. That is, the stem 35 of the LD module 31B has the same configuration as that of the stem 35 of the LD module 31A, and coincides with an object obtained by translationally moving the stem 35 of the LD module 31A in the −y direction. The LD element 36B mounted therein is different from the LD element 36A in a point of a structure which causes an optical signal having a wavelength different from that of the LD element 36A to be emitted. However, regarding other components, the LD module 31B coincides with an object obtained by translationally moving the LD module 31A in the −y direction. That is, in the optical module according to the embodiment, the first optical subassembly and the second optical subassembly have a common structure except for the light conversion element mounted therein. Thus, it is not required to design, manufacture, and prepare two kinds of optical subassemblies, and reduction of manufacturing cost is realized. If the same designed components can be used as components (TO-CAN package: PKG) other than the LD element in the LD module (TO-CAN TOSA), the quantity of the PKG is four per one optical module. Thus, reduction of price occurring by the quantity effect is also achieved. According to the examination of the inventors, in order to perform division into four LD modules, an outer diameter of (a stem) of the LD module is desirably equal to or smaller than 4 mm and further desirably equal to or smaller than 3.8 mm.

In the stem 35 according to the embodiment, the one pair of lead terminals 51A and 51B are disposed on the center line of the connection surface of the stem 35 in the y orientation. As described above, the one pair of lead terminals disposed on the end surface of the optical subassembly according to the embodiment are desirably disposed in the vicinity of the center line of the end surface of the optical subassembly in the y orientation. It is desirable that the one pair of lead terminals are disposed within a region of ±10% from the center in the y orientation with respect to the outer diameter (length from one edge to the other edge on the center line in the x orientation) of the end surface. It is more desirable that the one pair of lead terminals are disposed within a region of ±5% from the center.

The lead terminals included in the stem 35 are not limited only to the one pair of lead terminals 51A and 51B according to the embodiment, and may include another lead terminal. For example, the lead terminals may further include a lead terminal connected to an output electric signal of a monitor PD element which is disposed for detecting an optical output of the LD element. Regarding the ground potential, from a viewpoint of reduction in size of an optical subassembly, as in the embodiment, it is desirable that a ground conductor region of the flexible printed circuit board and the main body of the stem are directly brazed. However, it is not limited thereto. A lead ground terminal connected at the ground potential of the optical subassembly may be further included. In this case, it is necessary that the stem 35 is disposed to be reversed in the y orientation for the LD modules 31A and 31B.

The flexible printed circuit board 45B includes one pair of strip conductors 61A and 61B which are disposed on the front surface L1 thereof, a ground conductor layer 62 (not illustrated) disposed on the back surface L2 thereof, and ground conductor patterns 63A and 63B. Here, the strip conductor 61A corresponds to the second normal phase strip conductor. The strip conductor 61B corresponds to the second reverse phase strip conductor. The one pair of strip conductors 61A and 61B are disposed at a connection portion with the end surface of the LD module 31B in a row in order in the +x direction, and extend in parallel with each other in the −y direction. That is, the one pair of strip conductors 61A and 61B of the flexible printed circuit board 45A and the one pair of strip conductors 61A and 61B of the flexible printed circuit board 45B are arranged in order in the +x direction. However, the one pair of strip conductors 61A and 61B of the flexible printed circuit board 45A extend in the +y direction, and the one pair of strip conductors 61A and 61B of the flexible printed circuit board 45B extend in the −y direction. That is, a direction in which the strip conductors 61A and 61B of the flexible printed circuit board 45A extend is opposite to a direction in which the strip conductors 61A and 61B of the flexible printed circuit board 45B extend. As illustrated in FIG. 6, if the center line between the LD module 31A and the LD module 31B is set to be a straight line X1, the flexible printed circuit board 45B coincides with an object obtained by symmetrically moving the flexible printed circuit board 45A in line symmetry based on the straight line X1. If the flexible printed circuit board 45A and the flexible printed circuit board 45B overlap each other so as to cause outer edges to coincide with each other (if the flexible printed circuit board 45A is symmetrically moved in point symmetry based on a center O on the straight line X1), the flexible printed circuit board 45A and the flexible printed circuit board 45B completely coincide with each other and have the common structure. Disposition of the one pair of strip conductors 61A and 61B is performed so as to be reverse to each other. That is, the flexible printed circuit board 45A and the flexible printed circuit board 45B may be the same product. In a case where one of the one pair of strip conductors functions as the first normal phase strip conductor in the flexible printed circuit board 45A, this functions as the second reverse phase strip conductor in the flexible printed circuit board 45B. In a case where the other of the one pair of strip conductors functions as the first reverse phase strip conductor in the first flexible printed circuit board, this functions as the second normal phase strip conductor in the second flexible printed circuit board. In the optical module according to the embodiment, the first flexible printed circuit board and the second flexible printed circuit board have the common structure. Thus, it is not required to design, manufacture, and prepare two kinds of flexible printed circuit boards, and reduction of manufacturing cost is realized.

One end of each of the one pair of strip conductors 61A and 61B of the flexible printed circuit board 45A (or 45B) is connected to each of the one pair of lead terminals 51A and 51B of the LD module 31A (or 31B). The other end thereof is electrically connected to each of one pair of board signal terminals 71A and 71B of the printed circuit board 21. As illustrated in FIG. 5B, the printed circuit board 21 according to the embodiment has the first surface (upper surface) S1 and the second surface (lower surface) S2. A normal orientation of the first surface S1 and a normal orientation of the second surface S2 are directed in the y orientation together. Here, the first surface S1 rather than the second surface S2 is positioned on the positive side (upper part in FIG. 5B) of the y orientation. As illustrated in FIG. 5B, the flexible printed circuit board 45A is connected so as to cause the front surface L1 thereof to face the first surface S1. The flexible printed circuit board 45B is connected so as to cause the front surface L1 thereof to face the second surface S2.

Figure 7A:
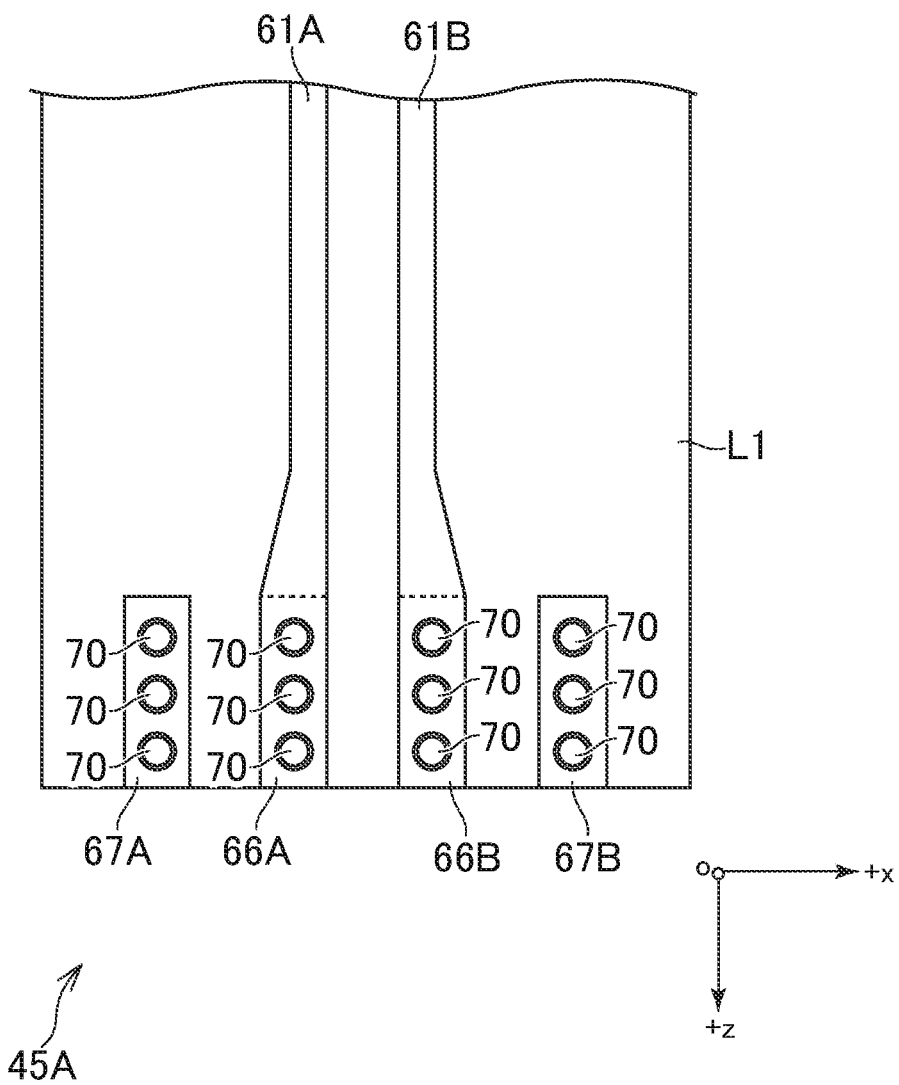
FIG. 7A is a plan view illustrating an end portion of the flexible printed circuit board according to the first embodiment of the present invention.
Figure 7B:
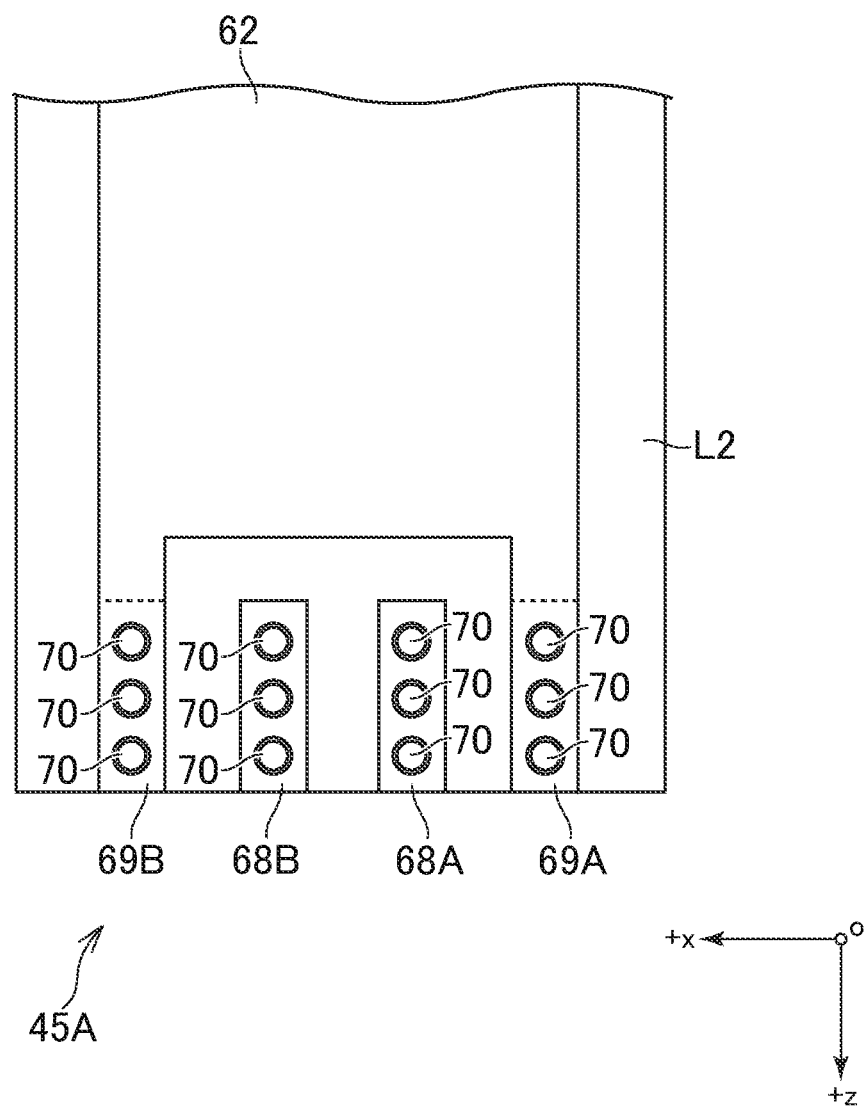
FIG. 7B is a bottom view illustrating the end portion of the flexible printed circuit board according to the first embodiment of the present invention.

FIG. 7A is a plan view illustrating an end portion of the flexible printed circuit board 45A (first flexible printed circuit board) according to the embodiment. FIG. 7B is a bottom view illustrating the end portion of the flexible printed circuit board 45A (first flexible printed circuit board) according to the embodiment. That is, FIG. 7A illustrates the front surface L1 of the flexible printed circuit board 45A, and FIG. 7B illustrates the back surface L2 of the flexible printed circuit board 45A. FIGS. 7A and 7B illustrate the +x direction (first orientation) and a +z direction. A z orientation is perpendicular to both the x orientation (first orientation) and the y orientation (second orientation). The one pair of strip conductors 61A and 61B disposed on the front surface L1 of the flexible printed circuit board 45A extend in parallel with each other, from one end (opening). The one pair of strip conductors 61A and 61B extend in parallel with each other in the +z direction and reach the other end, while each of the strip conductors 61A and 61B maintains a common predetermined width (first width). The one pair of strip conductors 61A and 61B extend in parallel with each other in the +z direction and reach the other end, while the strip conductors 61A and 61B are separate from each other with maintaining a predetermined gap (first gap). The one pair of strip conductors 61A and 61B include one pair of front-surface signal terminals 66A and 66B at the other end. At end portions of the one pair of strip conductors 61A and 61B on the other end side, the width of each of the one pair of strip conductors 61A and 61B gradually becomes wider than the predetermined width (first width), and then becomes equal to a width (second width) of the one pair of front-surface signal terminals 66A and 66B. Each of the one pair of strip conductors 61A and 61B reaches the other end while maintaining this width. At the end portions thereof on the other end side, the gap between the one pair of strip conductors 61A and 61B gradually becomes wider than the predetermined gap (first gap), and then becomes equal to a gap (second gap) between the one pair of front-surface signal terminals 66A and 66B. The strip conductors 61A and 61B reach the other end while maintaining this gap. Front-surface ground terminals 67A and 67B are disposed on the front surface of the flexible printed circuit board 45A, on an outside of each of the one pair of front-surface signal terminals 66A and 66B. The shape of the one pair of strip conductors 61A and 61B includes the shape of the one pair of front-surface signal terminals 66A and 66B and an adequate shape may be selected.

As illustrated in FIG. 7B, one pair of back-surface signal terminals 68A and 68B are disposed on the back surface of the flexible printed circuit board 45A so as to overlap the one pair of the front-surface signal terminals 66A and 66B in plan view. The ground conductor layer 62 includes one pair of back-surface ground terminals 69A and 69B at the other end. The one pair of back-surface ground terminals 69A and 69B are disposed to overlap the one pair of front-surface ground terminals 67A and 67B in plan view. A plurality of through-holes 70 are provided between the one pair of front-surface signal terminals 66A and 66B and the one pair of back-surface signal terminals 68A and 68B. Similarly, a plurality of through-holes 70 are provided between the front-surface ground terminals 67A and 67B and the back-surface ground terminals 69A and 69B. Practically, the coverlays 65 are disposed on the front surface L1 and the back surface L2, respectively, of the flexible printed circuit board 45A except for a region in which a terminal group (front-surface signal terminal, front-surface ground terminal, back-surface signal terminal, and back-surface ground terminal) is disposed. However, for simple descriptions, the illustration of the coverlays 65 are omitted in FIGS. 7A and 7B.

Figure 8:
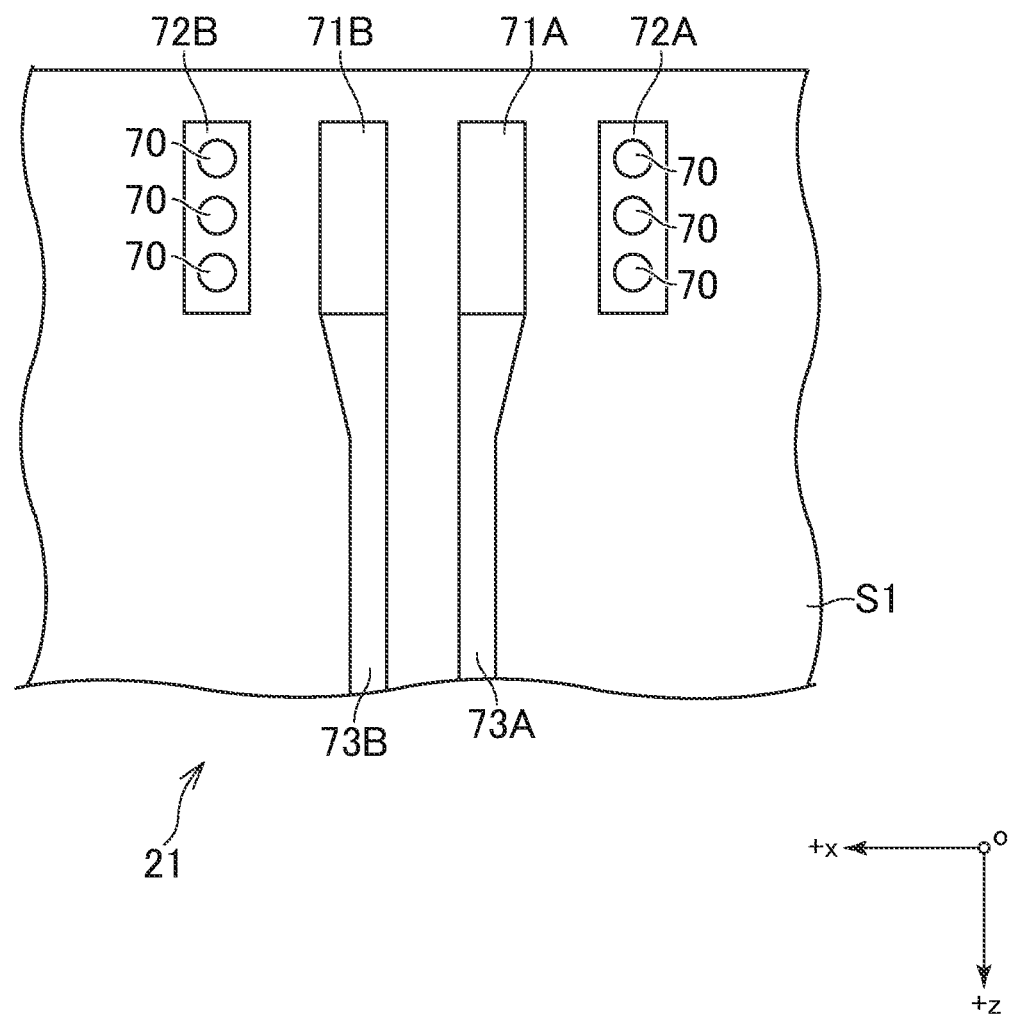
FIG. 8 is a plan view illustrating an end portion of a printed circuit board according to the first embodiment of the present invention.

FIG. 8 is a plan view illustrating an end portion of the printed circuit board 21 according to the embodiment. FIG. 8 illustrates the first surface S1 of the printed circuit board 21. The printed circuit board 21 includes the one pair of board signal terminals 71A and 71B and one pair of board ground terminals 72A and 72B which are disposed on the first surface S1. The printed circuit board 21 is disposed to face the LD modules 31A, 31B, 31C, and 31D in the z orientation. The one pair of board signal terminals 71A and 71B disposed at an end portion are arranged in order in the +x direction. Here, the board signal terminal 71A corresponds to the first normal phase board terminal connected to the first normal phase strip conductor. The board signal terminal 71B corresponds to the first reverse phase board terminal connected to the first reverse phase strip conductor. The one pair of front-surface signal terminals 66A and 66B of the flexible printed circuit board 45A are disposed to face the one pair of board signal terminals 71A and 71B disposed on the first surface S1 of the printed circuit board 21. The one pair of front-surface ground terminals 67A and 67B are disposed to face the one pair of board ground terminals 72A and 72B disposed on the first surface S1. A solder is injected from the back surface side of the flexible printed circuit board 45A and thus electric connection is secured. Thus, the one pair of front-surface signal terminals 66A and 66B are electrically connected to the one pair of board signal terminals 71A and 71B, respectively. The back-surface ground terminals 69A and 69B are electrically connected to the board ground terminals 72A and 72B.

The printed circuit board 21 includes one pair of strip conductors 73A and 73B on the first surface S1, and includes the one pair of board signal terminals 71A and 71B at one ends of the one pair of strip conductors 73A and 73B. Here, the strip conductor 73A corresponds to a first positive-phase board strip conductor and the strip conductor 73B corresponds to a first reverse-phase board strip conductor. As illustrated in FIG. 8, the width of each of the one pair of strip conductors 73A and 73B gradually becomes narrower than the width (second width) of the one pair of board signal terminals 71A and 71B, and then becomes equal to a predetermined width (third width). Each of the one pair of strip conductors 73A and 73B extends in the +z direction (lower direction illustrated in FIG. 8) while maintaining this width. The one pair of strip conductors 73A and 73B are connected to one pair of first IC signal terminals 91A and 91B of the IC 48. The one pair of strip conductors 73A and 73B extend with maintaining a gap (second gap) between the one pair of board signal terminals 71A and 71B. That is, the one pair of strip conductors 73A and 73B extend in parallel with each other in the +z direction. The shape of the one pair of strip conductors 73A and 73B includes the shape of the one pair of board signal terminals 71A and 71B and an adequate shape may be selected.

The printed circuit board 21 has a multilayer structure in which a plurality of metal layers are stacked. A dielectric layer is disposed between the metal layers which are adjacent to each other. When viewed from the first surface S1 side, among the metal layers in the multilayer structure, the one pair of strip conductors 73A and 73B and the board ground terminals 72A and 72B are disposed in the first metal layer. A ground conductor layer 74A (not illustrated) is disposed in the second metal layer. A plurality of through-holes 70 are provided between the board ground terminals 72A and 72B and the ground conductor layer 74A. When the flexible printed circuit board 45A and the printed circuit board 21 are connected to each other by solders, the solders are injected into the plurality of the through-holes 70 of the printed circuit board 21, and thus the board ground terminals 72A and 72B are electrically connected to the ground conductor layer 74A.

A micro-strip line type first differential transmission line is configured by including the one pair of strip conductors 73A and 73B and the ground conductor layer 74A. Here, the one pair of strip conductors 73A and 73B ideally extend in the −z direction, and then are connected to the one pair of first IC signal terminals 91A and 91B of the IC 48. The one pair of strip conductors 73A and 73B include a portion which is bent if necessary, in practice. The one pair of strip conductors 73A and 73B are connected to the one pair of first IC signal terminals 91A and 91B of the IC 48.

The end portion of the flexible printed circuit board 45B (second flexible printed circuit board) according to the embodiment has a structure which is common with that of the flexible printed circuit board 45A illustrated in FIGS. 7A and 7B. However, as described above, disposition of the one pair of strip conductors 61A and 61B is performed so as to be reverse to each other. Since the flexible printed circuit board 45B is connected so as to cause the front surface L1 to face the second surface S2 of the printed circuit board 21, the +x direction in the front surface L1 of the flexible printed circuit board 45B is reverse to the +x direction in the front surface L1 of the flexible printed circuit board 45A illustrated in FIG. 7A. The one pair of strip conductors 61A and 61B provided on the front surface L1 of the flexible printed circuit board 45B are arranged in a direction reverse to the one pair of strip conductors 61A and 61B illustrated in FIG. 7A, and are arranged in order in the +x direction (toward the left side from the right side in FIG. 7A). Similarly, the one pair of front-surface signal terminals 66A and 66B and the front-surface ground terminals 67A and 67B are arranged in a direction reverse to that in a case illustrated in FIG. 7A. The front-surface ground terminals 67A and 67B are maintained at the ground potential. Thus, there is no need for distinguishing the front-surface ground terminals 67A and 67B from each other. However, for simple descriptions, it is assumed that the front-surface ground terminals 67A and 67B are arranged in a reverse direction.

Similar to the front surface L1, regarding the back surface L2 of the flexible printed circuit board 45B (second flexible printed circuit board) according to the embodiment, the +x direction in the back surface L2 of the flexible printed circuit board 45B is reverse to the +x direction in the back surface L2 of the flexible printed circuit board 45A illustrated in FIG. 7B. The one pair of back-surface signal terminals 68A and 68B and the back-surface ground terminals 69A and 69B are arranged in a direction reverse to that in a case illustrated in FIG. 7B.

The above descriptions are similarly applied to the second surface S2 of the printed circuit board 21 according to the embodiment. The +x direction in the second surface S2 of the printed circuit board 21 is reverse to the +x direction in the first surface S1 illustrated in FIG. 8. One pair of strip conductors 75A and 75B provided on the second surface S2 of the printed circuit board 21 are arranged in a direction reverse to the one pair of strip conductors 73A and 73B in the first surface S1 illustrated in FIG. 8, and are arranged in order in the +x direction in FIG. 9 (toward the right side from the left side in FIG. 8). Here, the strip conductor 75A corresponds to a second normal phase board strip conductor. The strip conductor 75B corresponds to a second reverse phase board strip conductor. Similarly, the one pair of strip conductors 75A and 75B include the one pair of board signal terminals 71A and 71B at one end. However, the one pair of board signal terminals 71A and 71B and the board ground terminals 72A and 72B are arranged in a direction reverse to that in a case illustrated in FIG. 8.

When viewed from the second surface S2 side, among the metal layers in the multilayer structure of the printed circuit board 21, the one pair of strip conductors 75A and 75B and the board ground terminals 72A and 72B are disposed in the first metal layer. A ground conductor layer 74B (not illustrated) is disposed in the second metal layer. The one pair of board ground terminals 72A and 72B are electrically connected to the ground conductor layer 74B via the plurality of through-holes 70 by the solder. A micro-strip line type second differential transmission line is configured on the second surface S2 side of the printed circuit board 21 by including the one pair of strip conductors 75A and 75B and the ground conductor layer 74B. Here, the one pair of strip conductors 75A and 75B ideally extend in the +z direction, and then are connected to one pair of second IC signal terminals 92A and 92B of the IC 48. The IC 48 is mounted on the first surface S1 of the printed circuit board 21. In this case, since the IC 48 is electrically connected to the LD module 31B, the second differential transmission line extends on the second surface from the one pair of board signal terminals 71A and 71B (and the ground conductor layer 74B) (second surface differential transmission line). The second differential transmission line extends from the second surface to the first surface in a stacking direction (+y direction) (stacking direction differential transmission line), and then extends on the first surface (first surface differential transmission line), and thus is connected to the one pair of second IC signal terminals 92A and 92B. Details thereof will be described later.

In the embodiment, it is noted that xyz coordinates are defined with respect to a space. Thus, for example, when an observer views the optical module 2 from the +y direction (upper part of the printed circuit board 21), an order in which the one pair of lead terminals 51A and 51B in each of the LD modules 31A and 31B are arranged is directed in the +x direction. At a connection portion with the LD modules 31A and 31B, an order in which the one pair of strip conductors 61A and 61B in the flexible printed circuit boards 45A and 45B are arranged is directed in the +x direction. An order in which the one pair of strip conductors 61A and 61B of the flexible printed circuit boards 45A and 45B at a connection portion with the printed circuit board 21 are arranged (that is, order of arranging the pair of front-surface signal terminals 66A and 66B) is also directed in the +x direction. An order in which the one pair of board signal terminals 71A and 71B disposed on each of the first surface S1 and the second surface S2 of the printed circuit board 21 are arranged is also directed in the +x direction. With such a configuration, the LD modules 31A and 31B have the common configuration (other than the LD element). Thus, it is possible to prepare two LD modules 31A and 31B at low cost. Similarly, the flexible printed circuit boards 45A and 45B have the common configuration, and thus it is possible to prepare two flexible printed circuit boards 45A and 45B at low cost. Regardless of the order, in plan view, an order of a plurality of pairs of strip conductors disposed on the printed circuit board 21 for a normal phase can be the same as an order of a plurality of pairs of strip conductors disposed on the printed circuit board 21 for a reverse phase. As with the second differential transmission line, even in a case where the strip conductor is configured from the second surface to the first surface, the printed circuit board 21 can be configured without a need for the special structure, for example, in which an arrangement order is inverted by causing one pair of strip conductors to intersect three-dimensionally.

Figure 9:
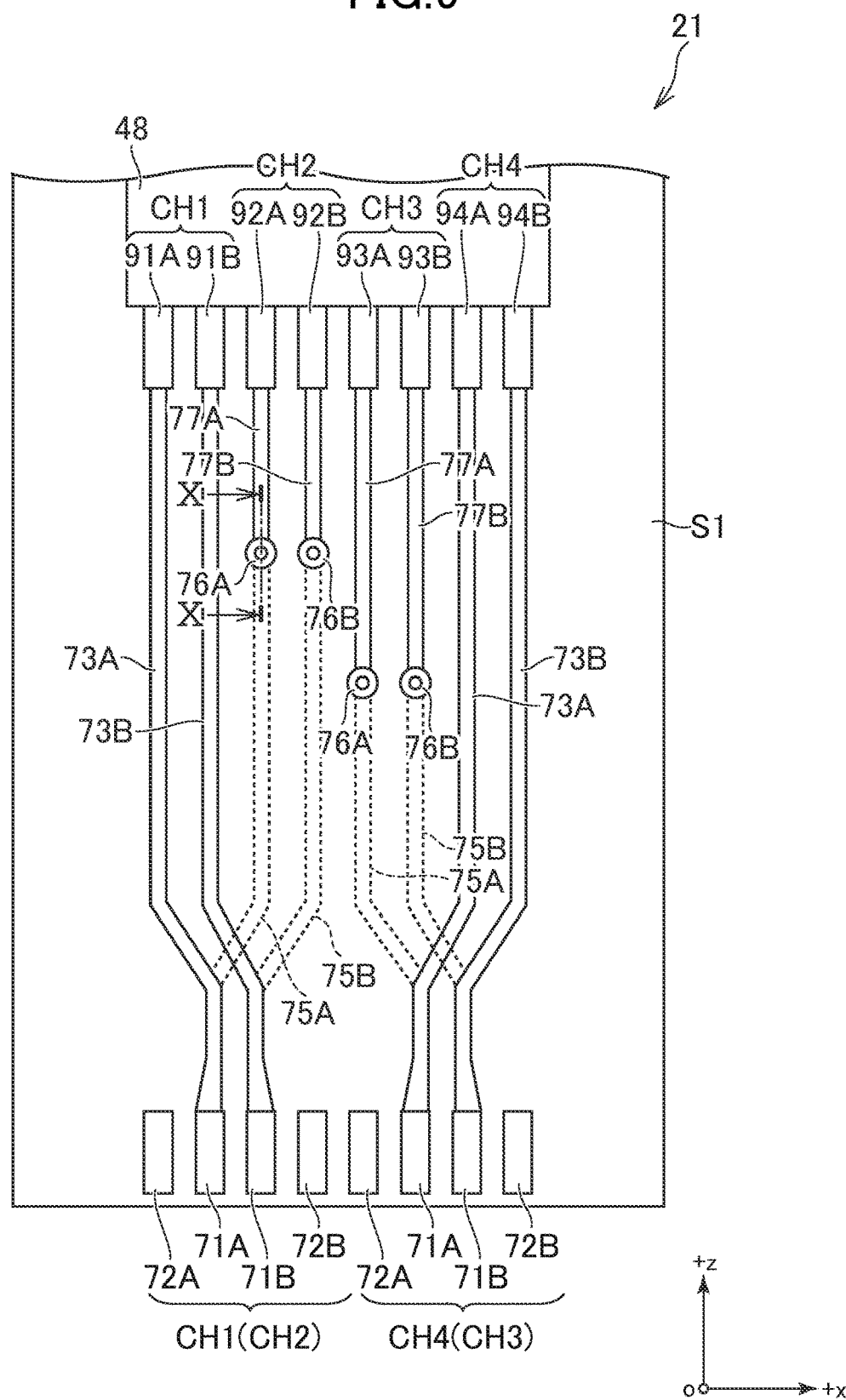
FIG. 9 is a plan view illustrating the printed circuit board according to the first embodiment of the present invention.
Figure 10:
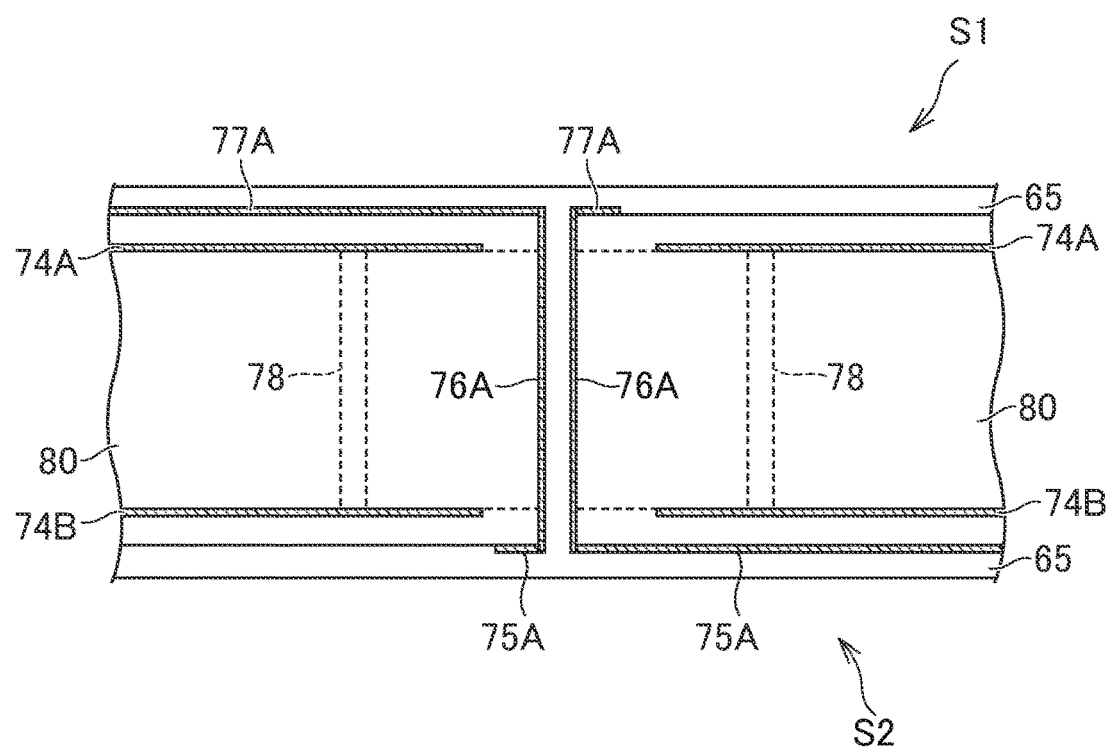
FIG. 10 is a cross-sectional view illustrating the printed circuit board according to the first embodiment of the present invention.

FIG. 9 is a plan view illustrating the printed circuit board 21 according to the embodiment. FIG. 10 is a cross-sectional view illustrating the printed circuit board 21 according to the embodiment. FIG. 9 illustrates a portion of the first surface S1 of the printed circuit board 21. FIG. 10 illustrates a cross-section taken along line X-X illustrated in FIG. 9. As described above, the flexible printed circuit boards 45A and 45D which are respectively connected to the LD modules 31A and 31D at the upper stage are connected to the first surface S1 of the printed circuit board 21. The flexible printed circuit boards 45B and 45C which are respectively connected to the LD modules 31B and 31C at the lower stage are connected to the second surface S2 of the printed circuit board 21. Four connection terminals (board ground terminal 72A, board signal terminal 71A, board signal terminal 71B, and board ground terminal 72B) for CH1 (LD module 31A) and four connection terminals for CH4 (LD module 31D) are arranged on the first surface S1 illustrated in FIG. 9, in order in the +x direction. Similarly, four connection terminals for CH2 (LD module 31B) and four connection terminals for CH3 (LD module 31C) are arranged on the second surface S2 in order in the +x direction. In plan view, the four connection terminals for CH1 overlap the four connection terminals for CH2, respectively. The four connection terminals for CH4 overlap the four connection terminals for CH3, respectively.

The IC 48 has a rectangular shape. The one pair of first IC signal terminals 91A and 91B for CH1, the one pair of second IC signal terminals 92A and 92B for CH2, one pair of third IC signal terminals 93A and 93B for CH3, and one pair of fourth IC signal terminals 94A and 94B for CH4 are arranged on one side of the rectangular shape, which extends in the x orientation and faces the connection terminals for CH1 and CH4 on the first surface S1, in order in the +x direction. Here, the first IC signal terminal 91A for CH1 corresponds to the first normal phase IC terminal. The first IC signal terminal 91B for CH1 corresponds to the first reverse phase IC terminal. Similarly, the second IC signal terminal 92A for CH2 corresponds to the second normal phase IC terminal, and the second IC signal terminal 92B for CH2 corresponds to the second reverse phase IC terminal. The above descriptions are similarly applied to cases of CH3 and CH4.

As described above, the one pair of strip conductors 73A and 73B extend from the one pair of board signal terminals 71A and 71B for CH1, and are respectively connected to the one pair of first IC signal terminals 91A and 91B (for CH1). The first differential transmission line is configured by including the one pair of the strip conductors 73A and 73B and the ground conductor layer 74A. The second differential transmission line includes the one pair of strip conductors 75A and 75B disposed on the second surface S2, one pair of via-holes 76A and 76B, one pair of strip conductors 77A and 77B disposed on the first surface S1, the ground conductor layer 74B, a plurality of ground via-holes 78 (not illustrated), and the ground conductor layer 74A. The second differential transmission line is connected to each of the one pair of second IC signal terminals 92A and 92B (for CH2). Each of the one pair of strip conductors 75A and 75B has a land portion at one end thereof. Similarly, each of the one pair of strip conductors 77A and 77B has a land portion at one end thereof. Each of the one pair of via-holes 76A and 76B electrically connects each of the land portions of the one pair of strip conductors 75A and 75B and each of the land portions of the one pair of strip conductors 77A and 77B. The plurality of ground via-holes 78 electrically connect the ground conductor layer 74B and the ground conductor layer 74A.

As described above, the second differential transmission line includes the second-surface differential transmission line, the stacking-direction differential transmission line, and the first-surface differential transmission line. The second-surface differential transmission line includes the one pair of strip conductors 75A and 75B and the ground conductor layer 74B. The stacking-direction differential transmission line includes the one pair of via-holes 76A and 76B, and the plurality of ground via-holes 78. The first-surface differential transmission line includes the one pair of strip conductors 77A and 77B and the ground conductor layer 74. The one pair of strip conductors 77A and 77B extend so as to be respectively connected to the one pair of second IC signal terminals 92A and 92B for (CH2).

The transmission line (third differential transmission line) for CH3 has the same structure as that of the transmission line for CH2. The transmission line (fourth differential transmission line) for CH4 has the same structure as that of the transmission line for CH1. As illustrated in FIG. 10, similar to the flexible printed circuit boards 45A and 45B, the coverlays 65 are disposed on the first surface S1 and the second surface S2 of the printed circuit board 21, respectively. However, for simple descriptions, the illustration of the coverlay 65 is omitted in FIG. 9. As illustrated in FIG. 10, the flexible printed circuit board 21 has a multilayer structure. However, a dielectric layer 80 is disposed between metal layers which are adjacent to each other.

In the embodiment, the first IC signal terminals 91A and 91B, the second IC signal terminals 92A and 92B, the third IC signal terminals 93A and 93B, and the fourth IC signal terminals 94A and 94B which are disposed in the IC 48 are disposed in order in the +x direction. By arranging the differential transmission line (the strip conductor of the differential transmission line) to be close to a straight line as much as possible, it is possible to realize space saving. Accordingly, as in the embodiment, it is desirable that the IC signal terminals are disposed in a row in order in the +x direction. However, it is not limited thereto. For example, the IC signal terminals may be disposed in a row in order in the z orientation of the IC 48. In this case, it is assumed that the IC signal terminals are disposed in order in a positive direction of a third orientation. In the embodiment, the positive direction of the third orientation corresponds to the positive direction of the first orientation.

The optical module according to the embodiment is best in a case where the outer diameter of an optical subassembly is equal to or smaller than 4.0 mm. In the embodiment, the IC 48 is a driving circuit which can control the four LD modules 31A, 31B, 31C, and 31D. In a case where the IC is mounted on the first surface S1 of the printed circuit board 21, the LD modules 31A and 31D at the upper stage are connected to the connection terminal on the first surface S1 via the flexible printed circuit boards 45A and 45D. On the contrary, the LD modules 31B and 31C at the lower stage are connected to the connection terminal on the second surface S2 via the flexible printed circuit boards 45B and 45C. In this case, the differential transmission line corresponds to the stacking-direction differential transmission line, and is required to move from the second surface S2 to the first surface S1. Generally, plural pairs of IC signal terminals disposed in the IC 48 are repetitively arranged in a row in an order of a normal phase, a reverse phase, a normal phase, and a reverse phase. Even in the differential transmission line which moves from the second surface S2 to the first surface S1, it is important to maintain an arrangement order of a normal phase and a reverse phase of one pair of strip conductors of each channel. In the embodiment, a direction in which the first flexible printed circuit board extends is opposite to a direction in which the second flexible printed circuit board extends. Thus, in plan view, it is possible to easily maintain an arrangement order of the normal phase and the reverse phase.

Non-conformity of characteristic impedance easily occurs at a connection portion between the flexible printed circuit board and the printed circuit board. In order to perform more conforming of the characteristic impedance, structural optimization using an electromagnetic field simulation is required. For example, in a case where the characteristic impedance in a case where the surface (front surface or back surface) of the flexible printed circuit board is connected to the first surface of the printed circuit board is different from the characteristic impedance in a case where the surface (front surface or back surface) of the flexible printed circuit board is connected to the second surface of the printed circuit board, inductance or capacitance restricted at the connection portion also varies. Thus, the configuration (shape of the one pair of strip conductors) of the differential transmission line disposed on each of the first surface and the second surface of the printed circuit board is changed. Accordingly, a long time takes for design and manufacturing cost is increased. In the optical module according to the embodiment, a mounting direction of the flexible printed circuit board based on the printed circuit board is not changed between cases of the first surface and the second surface, and an arrangement order of the normal phase and the reverse phase in plan view may be set. Thus, it is possible to reduce the manufacturing cost. In this specification, for convenient descriptions, the terms called as the normal phase and the reverse phase are used. However, even though the arrangement of the normal phase and the reverse phase in the embodiment is reverse to each other, the effect of the present invention is obtained. In this case, a direction set as the +x direction is inverted.

Second Embodiment

Figure 11:
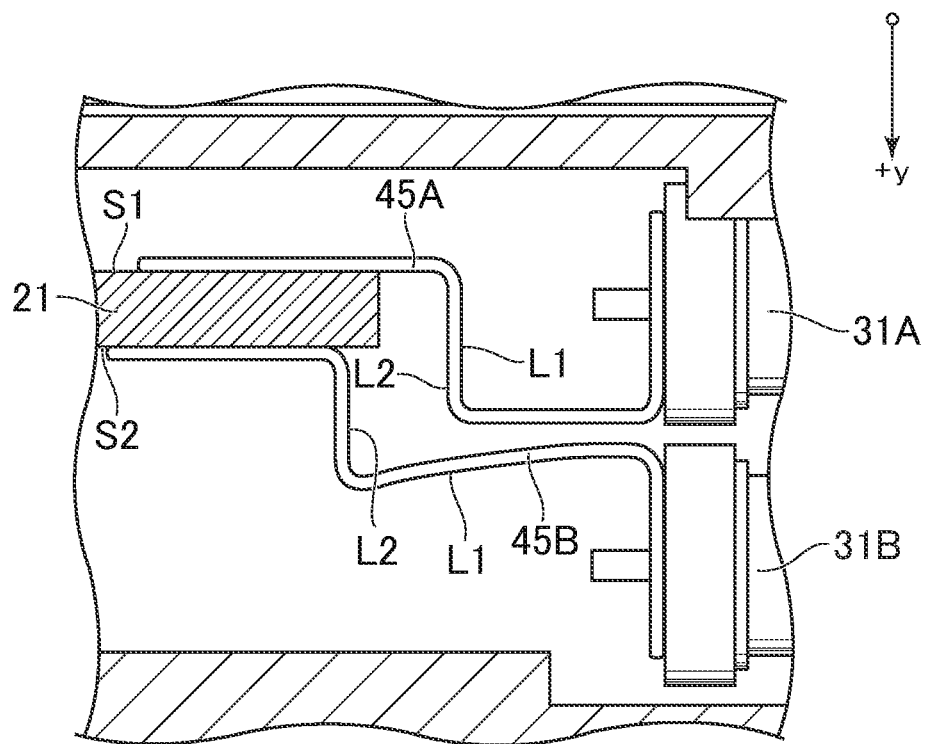
FIG. 11 is a cross-sectional view illustrating an optical module according to a second embodiment of the present invention.
Figure 12:
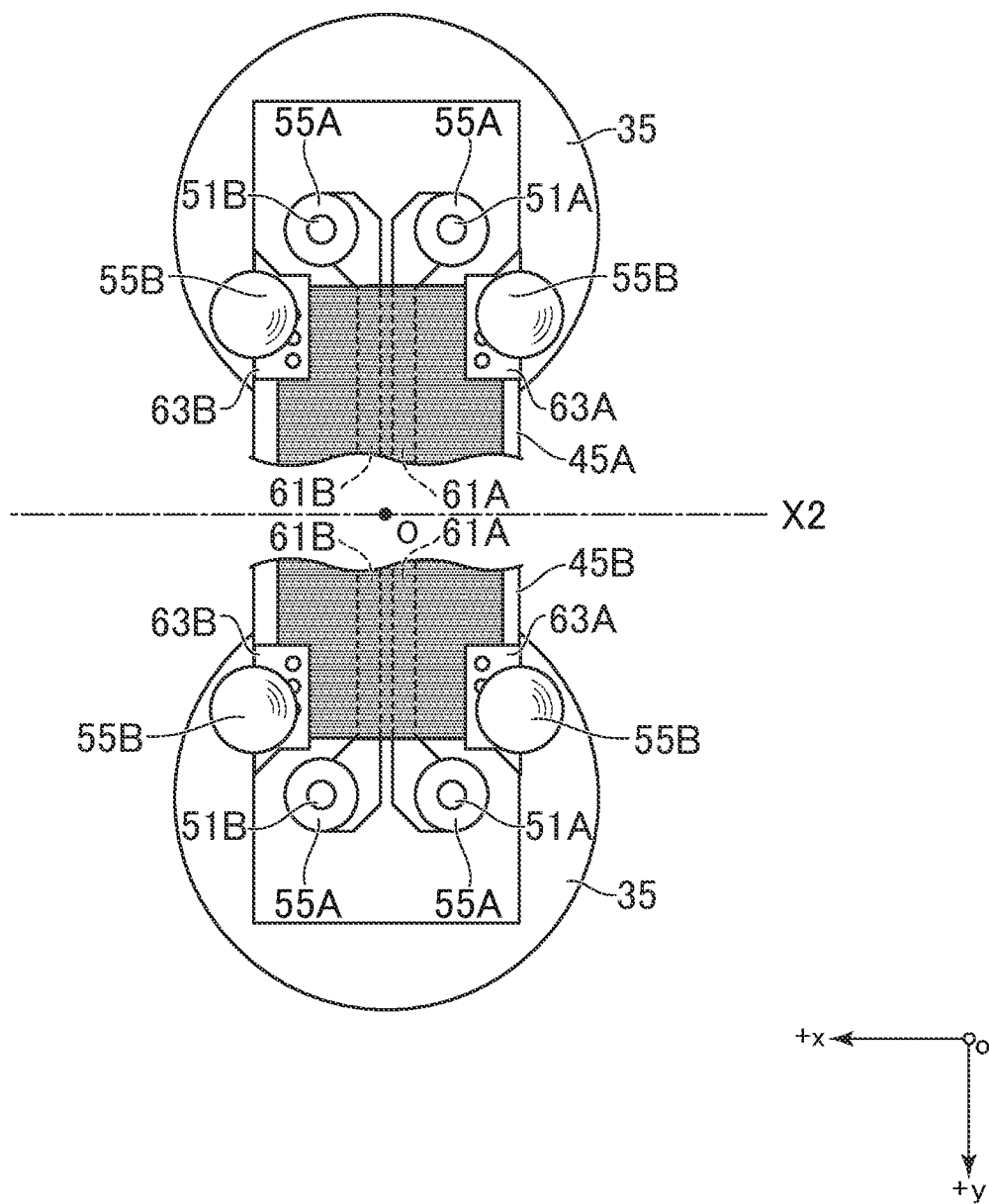
FIG. 12 is a diagram illustrating a connection relationship between two LD modules and two flexible printed circuit boards according to the second embodiment of the present invention.

FIG. 11 is a cross-sectional view illustrating an optical module 2 according to a second embodiment of the present invention. FIG. 12 is a diagram illustrating a connection relationship between two LD modules 31A and 31B and two flexible printed circuit boards 45A and 45B according to the embodiment. The optical module 2 according to the embodiment has the same structure as that in the first embodiment except that the connection relationship of the two flexible printed circuit boards 45A and 45B with the LD modules 31A and 31B or the connection relationship with the printed circuit board 21 are different from those in the first embodiment.

As illustrated in FIG. 12, one pair of strip conductors 61A and 61B in the flexible printed circuit board 45A are disposed in a row in order in the +x direction and extend in parallel with each other in a lower direction in FIG. 12, at a connection portion with the end surface of the LD module 31A. On the contrary, one pair of strip conductors 61A and 61B in the flexible printed circuit board 45B are disposed in a row in order in the +x direction and extend in parallel with each other in an upper direction in FIG. 12, at a connection portion with the end surface of the LD module 31B. In the specification, regarding the direction of the second orientation (y orientation), since a direction in which the one pair of strip conductors 61A, 61B of the first flexible printed circuit board extend is defined to be the positive direction, as illustrated in FIG. 12, in the second embodiment, the direction of the y orientation is opposite to a direction of the y orientation in the first embodiment. That is, the one pair of strip conductors 61A and 61B of the flexible printed circuit board 45A extend in the +y direction, at a connection portion with the end surface of the LD module 31A. The one pair of strip conductors 61A and 61B of the flexible printed circuit board 45B extend in the −y direction, at the connection portion with the end surface of the LD module 31B. However, as described above, since the direction of the +y direction is opposite to that in the first embodiment, both thereof extend in a direction of being closer to each other.

In the embodiment, the first surface S1 of the printed circuit board 21 rather than the second surface S2 is positioned on the negative side (upper part in FIG. 11) of the y orientation. The LD module 31A and the LD module 31B are disposed in a row in order in the +y direction. As illustrated in FIG. 11, the flexible printed circuit board 45A is connected to the LD module 31A so as to cause the end surface of the LD module 31A to face the back surface L2 of the flexible printed circuit board 45A. The flexible printed circuit board 45A is connected to the printed circuit board 21 so as to cause the back surface L2 of the flexible printed circuit board 45A to face the first surface S1 of the printed circuit board 21. On the contrary, the flexible printed circuit board 45B is connected to the LD module 31B so as to cause the end surface of the LD module 31B to face the back surface L2 of the flexible printed circuit board 45B. The flexible printed circuit board 45A is connected to the printed circuit board 21 so as to cause the back surface L2 of the flexible printed circuit board 45B to face the first surface S1 of the printed circuit board 21.

The flexible printed circuit boards 45A and 45B extend in a direction of being close to each other, from portions which are respectively connected to the LD modules 31A and 31B. However, the flexible printed circuit boards 45A and 45B are bent to move to the printed circuit board 21 together so as to face the back surfaces L2 thereof. The back surfaces L2 on which ground conductor layer 42 is disposed face each other, and thus crosstalk occurring between the flexible printed circuit boards 45A and 45B which are disposed to be adjacent to each other is reduced. In order to realize high density mounting, LD modules are disposed to be adjacent to each other at a short distance, and thus crosstalk would occur between the LD modules. However, in the optical module 2 according to this embodiment, it is possible to exhibit an effect similar to that of the optical module 2 according to the first embodiment and to reduce the crosstalk.

In the embodiment, the flexible printed circuit board 45A is connected to the printed circuit board 21 so as to cause the back surface L2 of the flexible printed circuit board 45A to face the first surface S1 of the printed circuit board 21. However, the flexible printed circuit board 45A according to the embodiment has the same structure as that of the flexible printed circuit board 45A according to the first embodiment illustrated in FIGS. 7A and 7B. In other words, in both the first embodiment and the second embodiment, it is possible to use the flexible printed circuit boards 45A and 45B having the same structure. In this embodiment, since the back surface L2 of the flexible printed circuit board 45A faces the first surface S1 of the printed circuit board 21, the one pair of back-surface signal terminals 68A and 68B illustrated in FIG. 7B are disposed to overlap the one pair of board signal terminals 71A and 71B illustrated in FIG. 8. The back-surface ground terminals 69A and 69B illustrated in FIG. 7B overlap the board ground terminals 72A and 72B illustrated in FIG. 8. The solder is injected through the one pair of front-surface signal terminals 66A and 66B and the front-surface ground terminals 67A and 67B illustrated in FIG. 7A, and thus an electrical connection is secured.

Even in this embodiment, similar to the first embodiment, an order in which the one pair of lead terminals 51A and 51B in each of the LD modules 31A and 31B are arranged is directed in the +x direction. An order in which the one pair of strip conductors 61A and 61B of the flexible printed circuit boards 45A and 45B at a connection portion with the LD modules 31A and 31B are arranged is also directed in the +x direction. An order in which the one pair of strip conductors 61A and 61B of the flexible printed circuit boards 45A and 45B at a connection portion with the printed circuit board 21 are arranged (that is, order of arranging the pair of front-surface signal terminals 66A and 66B) is also directed in the +x direction. An order in which the one pair of board signal terminals 71A and 71B disposed on each of the first surface S1 and the second surface S2 of the printed circuit board 21 are arranged is also directed in the +x direction.

Hitherto, the optical module, the optical transmission equipment, and the optical transmission system according to the embodiment of the present invention are described. The present invention is not limited to the above embodiments, and can be widely applied to an optical transmitter module and an optical receiver module. In the embodiments, a case where the optical subassembly is an LD module, that is, a case where the optical subassembly includes a light-emitting element is described. However, it is not limited thereto. The present invention can also be applied in a case where the optical subassembly is a PD module, that is, in a case where the optical subassembly includes a light-receiving element.

In the embodiments, a case where the IC is mounted on the first surface of the printed circuit board is described. However, the IC may be mounted on the second surface by symmetry. In a case where the IC is mounted on the second surface of the printed circuit board, the first differential transmission line extends from the first normal phase board terminal and the first reverse phase board terminal on the first surface, extends from the first surface to the second surface in the stacking direction, and then extends on the second surface so as to be connected to the first normal phase IC terminal and the first reverse phase IC terminal. The second differential transmission line extends from the second normal phase board terminal and the second reverse phase board terminal on the second surface, and thus is connected to the second normal phase IC terminal and the second reverse phase IC terminal.

In the embodiment, the IC 48 for transmission and the IC 49 for receiving are mounted together on the first surface S1 of the printed circuit board 21. However, it is not limited thereto. For example, the IC 48 may be mounted on the first surface S1 and the IC 49 may be mounted on the second surface S2. In this case, the flexible printed circuit board 22B is connected to the second surface S2.

In the embodiments, the first optical subassembly and the second optical subassembly are disposed in a row in the second orientation (vertical orientation). However, it is not limited thereto. For example, even if the first optical subassembly and the second optical subassembly are disposed in a row in the first orientation (horizontal orientation), in a case where it is necessary that the first optical subassembly and the second optical subassembly are separately connected to the first surface and the second surface, the present invention can be applied. In this specification, "being directed in the first orientation" is not limited to a case of being in parallel with the first orientation, and includes a case of being disposed so as to be directed in the first orientation.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical module comprising:
   a first optical subassembly, including a first normal phase lead terminal and a first reverse phase lead terminal which are disposed on an end surface so as to be in a row in order in a positive direction of a first orientation;
   a second optical subassembly, including a second normal phase lead terminal and a second reverse phase lead terminal which are disposed on the end surface so as to be in a row in order in the positive direction of the first orientation;
   a first flexible printed circuit board, including a first normal phase strip conductor connected to the first normal phase lead terminal, a first reverse phase strip conductor connected to the first reverse phase lead terminal, and a ground conductor layer disposed on a back surface, the first normal phase strip conductor and the first reverse phase strip conductor being disposed on a front surface to extend in parallel with each other;
   a second flexible printed circuit board, including a second normal phase strip conductor connected to the second normal phase lead terminal, a second reverse phase strip conductor connected to the second reverse phase lead terminal, and a ground conductor layer disposed on the back surface, the second normal phase strip conductor and the second reverse phase strip conductor being disposed on the front surface to extend in parallel with each other;
   a printed circuit board, including a first surface and a second surface; and
   an IC, being mounted on any one of the first surface and the second surface of the printed circuit board, and is electrically connected to the first optical subassembly and the second optical subassembly together,
   wherein the first flexible printed circuit board is connected to the first optical subassembly so as to cause the back surface of the first flexible printed circuit board to face the end surface of the first optical subassembly,
   wherein the second flexible printed circuit board is connected to the second optical subassembly so as to cause the back surface of the second flexible printed circuit board to face the end surface of the second optical subassembly,
   wherein the first normal phase strip conductor and the first reverse phase strip conductor of the first flexible printed circuit board extend at a connection portion with the end surface of the first optical subassembly in a positive direction of a second orientation which intersects with the first orientation,
   wherein a normal orientation of the first surface of the printed circuit board and a normal orientation of the second surface thereof are directed in the second orientation together,
   wherein the printed circuit board further includes a first normal phase board terminal connected to the first normal phase strip conductor and a first reverse phase board terminal connected to the first reverse phase strip conductor, the first normal phase board terminal and the first reverse phase board terminal being disposed on the first surface in a row in order in the positive direction of the first orientation, and
   wherein the printed circuit board further includes a second normal phase board terminal connected to the second normal phase strip conductor and a second reverse phase board terminal connected to the second reverse phase strip conductor, the second normal phase board terminal and the second reverse phase board terminal being disposed on the second surface in a row in order in the positive direction of the first orientation.

2. The optical module according to claim 1,
   wherein the first surface of the printed circuit board rather than the second surface is disposed on a positive side of the second orientation,
   wherein the first flexible printed circuit board is connected to cause the front surface to face the first surface, and wherein the second flexible printed circuit board is connected to cause the front surface to face the second surface.

3. The optical module according to claim 2, wherein the first optical subassembly and the second optical subassembly are disposed in a row in order in the negative direction of the second orientation.

4. The optical module according to claim 1, wherein the first surface of the printed circuit board rather than the second surface is disposed on a negative side of the second orientation,
wherein the first flexible printed circuit board is connected to cause the back surface to face the first surface, and
wherein the second flexible printed circuit board is connected to cause the back surface to face the second surface.

5. The optical module according to claim 4, wherein the first optical subassembly and the second optical subassembly are disposed in a row in order in the positive direction of the second orientation.

6. The optical module according to claim 2, wherein the first optical subassembly and the second optical subassembly are disposed in a row in the second orientation.

7. The optical module according to claim 2 wherein the first flexible printed circuit board and the second flexible printed circuit board have common structure.

8. The optical module according to claim 2, wherein the first optical subassembly and the second optical subassembly have a common structure except that each of the first optical subassembly and the second optical subassembly includes a light-emitting element configured to emit an optical signal of a different wavelength.

9. An optical transmission equipment in which the optical module according to claim 2 is mounted.

10. An optical module comprising:
a first optical subassembly, including a first normal phase lead terminal and a first reverse phase lead terminal which are disposed on an end surface so as to be in a row in order in a positive direction of a first orientation;
a second optical subassembly, including a second normal phase lead terminal and a second reverse phase lead terminal which are disposed on the end surface so as to be in a row in order in the positive direction of the first orientation;
a first flexible printed circuit board, including a first normal phase strip conductor connected to the first normal phase lead terminal, a first reverse phase strip conductor connected to the first reverse phase lead terminal, and a ground conductor layer disposed on a back surface, the first normal phase strip conductor and the first reverse phase strip conductor being disposed on a front surface to extend in parallel with each other;
a second flexible printed circuit board, including a second normal phase strip conductor connected to the second normal phase lead terminal, a second reverse phase strip conductor connected to the second reverse phase lead terminal, and a ground conductor layer disposed on the back surface, the second normal phase strip conductor and the second reverse phase strip conductor being disposed on the front surface to extend in parallel with each other;
a printed circuit board, including a first surface and a second surface; and
an IC, being mounted on any one of the first surface and the second surface of the printed circuit board, and is electrically connected to the first optical subassembly and the second optical subassembly together,
wherein both of the first optical subassembly and second optical subassembly include either light-emitting elements or light-receiving elements,
wherein the first flexible printed circuit board is connected to the first optical subassembly so as to cause the back surface of the first flexible printed circuit board to face the end surface of the first optical subassembly,
wherein the second flexible printed circuit board is connected to the second optical subassembly so as to cause the back surface of the second flexible printed circuit board to face the end surface of the second optical subassembly,
wherein the first normal phase strip conductor and the first reverse phase strip conductor of the first flexible printed circuit board extend at a connection portion with the end surface of the first optical subassembly in a positive direction of a second orientation which intersects with the first orientation,
wherein the second normal phase strip conductor and the second reverse phase strip conductor of the second flexible printed circuit board extend at a connection portion with the end surface of the second optical subassembly in a negative direction of the second orientation,
wherein the first optical subassembly and the second optical subassembly are disposed in a row in the second orientation,
wherein the printed circuit board further comprises:
a first differential transmission line connected to the first normal phase board terminal and the first reverse phase board terminal; and
a second differential transmission line connected to the second normal phase board terminal and the second reverse phase board terminal,
wherein the IC includes a first normal phase IC terminal and a first reverse phase IC terminal which are disposed in a row in order in a positive direction of a third orientation, and includes a second normal phase IC terminal and a second reverse phase IC terminal which are disposed in a row in order in the positive direction of the third orientation,
wherein the IC is mounted on the first surface of the printed circuit board,
wherein the first differential transmission line extends from the first normal phase board terminal and the first reverse phase board terminal on the first surface, so as to be connected to the first normal phase IC terminal and the first reverse phase IC terminal, and
wherein the second differential transmission line extends from the second normal phase board terminal and the second reverse phase board terminal on the second surface, extends from the second surface to the first surface in a stacking direction, and then extends on the first surface so as to be connected to the second normal phase IC terminal and the second reverse phase IC terminal.

11. The optical module according to claim 10, wherein the positive direction of the third orientation corresponds to the positive direction of the first orientation.

* * * * *